(12) United States Patent
Yoo et al.

(10) Patent No.: US 8,683,529 B2
(45) Date of Patent: *Mar. 25, 2014

(54) DIGITAL BROADCASTING SYSTEM AND METHOD OF PROCESSING DATA IN DIGITAL BROADCASTING SYSTEM

(75) Inventors: Hui Sang Yoo, Seoul (KR); In Hwan Choi, Gyeonggi-do (KR); Chul Soo Lee, Seoul (KR); Jae Hyung Song, Seoul (KR); Min Sung Kwak, Seoul (KR)

(73) Assignee: LG Electronics Inc., Seoul (KR)

( * ) Notice: Subject to any disclaimer, the term of this patent is extended or adjusted under 35 U.S.C. 154(b) by 1278 days.

This patent is subject to a terminal disclaimer.

(21) Appl. No.: 12/197,879

(22) Filed: Aug. 25, 2008

(65) Prior Publication Data

US 2009/0055865 A1 Feb. 26, 2009

Related U.S. Application Data

(60) Provisional application No. 60/957,714, filed on Aug. 24, 2007, provisional application No. 60/974,084, filed on Sep. 21, 2007, provisional application No. 60/977,379, filed on Oct. 4, 2007, provisional application No. 61/044,504, filed on Apr. 13, 2008, provisional application No. 61/076,686, filed on Jun. 29, 2008.

(30) Foreign Application Priority Data

Aug. 22, 2008 (KR) .................. 10-2008-0082582

(51) Int. Cl.
*H04N 7/16* (2011.01)
*H04N 7/18* (2006.01)
*H04N 7/20* (2006.01)
*H04N 7/173* (2011.01)
*H04N 7/12* (2006.01)
*H04H 20/71* (2008.01)
*H04H 20/74* (2008.01)

(52) U.S. Cl.
USPC ............... 725/62; 725/63; 725/68; 725/86; 725/105; 375/240.27; 455/3.02; 455/3.03; 455/3.06

(58) Field of Classification Search
None
See application file for complete search history.

(56) References Cited

U.S. PATENT DOCUMENTS

| 5,754,651 | A | 5/1998 | Blatter et al. |
| 6,924,847 | B2 * | 8/2005 | Choi et al. ............ 348/614 |
| 2005/0166244 | A1 | 7/2005 | Moon |
| 2006/0072623 | A1 | 4/2006 | Park |
| 2006/0126668 | A1 | 6/2006 | Kwon et al. |
| 2006/0140301 | A1 | 6/2006 | Choi |
| 2006/0184965 | A1 | 8/2006 | Lee et al. |
| 2007/0071110 | A1 | 3/2007 | Choi et al. |
| 2007/0089148 | A1 * | 4/2007 | Oh et al. ............ 725/90 |
| 2007/0101352 | A1 | 5/2007 | Rabina |
| 2007/0121681 | A1 | 5/2007 | Kang et al. |
| 2007/0174884 | A1 * | 7/2007 | Kim et al. ............ 725/100 |
| 2009/0044231 | A1 * | 2/2009 | Oh et al. ............ 725/62 |
| 2009/0060051 | A1 * | 3/2009 | Song et al. ............ 375/240.25 |
| 2009/0260041 | A1 * | 10/2009 | McGinn et al. ............ 725/62 |

FOREIGN PATENT DOCUMENTS

| EP | 0996291 | 4/2000 |
| EP | 1628420 | 2/2006 |
| EP | 1768396 | 3/2007 |
| JP | 11-069253 | 3/1999 |
| JP | 2001-54031 | 2/2001 |
| JP | 2002-141877 | 5/2002 |
| JP | 2003-134117 | 5/2003 |
| JP | 2004-129126 | 4/2004 |
| JP | 2007-096403 | 4/2007 |
| KR | 10-2001-0022306 | 3/2001 |
| KR | 10-2003-0030175 | 4/2003 |
| KR | 10-2003-0037138 | 5/2003 |
| KR | 10-2004-0032282 A | 4/2004 |
| KR | 10-2004-0032283 A | 4/2004 |
| KR | 10-2005-0062867 | 6/2005 |
| KR | 10-2005-0066954 A | 6/2005 |
| KR | 10-2005-0072988 A | 7/2005 |
| KR | 10-2005-0117314 | 12/2005 |

| | | |
|---|---|---|
| KR | 10-2005-0118206 A | 12/2005 |
| KR | 10-2006-0012510 | 2/2006 |
| KR | 10-2006-0013999 | 2/2006 |
| KR | 10-2006-0063867 | 6/2006 |
| KR | 10-2006-0070665 | 6/2006 |
| KR | 10-2006-0133011 A | 12/2006 |
| KR | 10-2007-0015810 A | 2/2007 |
| KR | 10-2007-0030739 A | 3/2007 |
| KR | 10-2007-0055671 A | 5/2007 |
| KR | 10-2007-0068960 A | 7/2007 |
| KR | 1020070075549 | 7/2007 |
| WO | 01/28246 | 4/2001 |
| WO | 03/017254 A1 | 2/2003 |
| WO | 03/049449 | 6/2003 |
| WO | 2004/057873 | 7/2004 |
| WO | 2004/066652 | 8/2004 |
| WO | 2005/032034 | 4/2005 |

OTHER PUBLICATIONS

ESTI TS 102 470 V1.1.1, Digital Video Broadcasting (DVB); IP Datacast over DVB-H; Program Specific Information (PSI)/Service Information (SI), Apr. 2006.

DVB Document A092 Rev. 2 (Draft v1.3.1), DVB-H Implementation Guidelines, May 2007 (www.dvb-h.org).

ETSI EN 300 401 V1.4.1, Radio Broadcasting Systems; Digital Audio Broadcasting (DAB) to mobile, portable and fixed receivers, Jun. 2006.

ETSI ES 201 735 V1.1.1, Digital Audio Broadcasting (DAB); Internet Protocol (IP) datagram tunnelling, Sep. 2000.

* cited by examiner

*Primary Examiner* — Nasser Goodarzi
*Assistant Examiner* — Fred Peng
(74) *Attorney, Agent, or Firm* — Lee, Hong, Degerman, Kang & Waimey

(57) ABSTRACT

The present invention provides a method of processing data. The method of processing data includes receiving a broadcasting signal where mobile service data are multiplexed with main service data, extracting transmission-parameter-channel signaling information and fast-information-channel signaling information from a data group within the received mobile service data; obtaining first program table information describing virtual channel information of an ensemble and a service provided by the ensemble using the fast-information-channel signaling information, the ensemble the ensemble corresponding to a virtual channel group of the received mobile service data, obtaining information indicating that second program table information, which describes an additional service provided by the ensemble, is included in the ensemblem and parsing the second program table information according to the obtained information; and providing the additional service by using the second program table information.

20 Claims, 21 Drawing Sheets

MH Header   MH Payload

▨ First MH Header indicating the MH payload contains signaling data
▦ Second MH Header indicating the MH payload contains signaling data and service data
▧ Third MH Header indicating the MH payload contains service data
▩ Signaling data payload
▨ IP Datagram 1
▧ IP Datagram 2

FIG. 15

| Syntax | # of bits |
|---|---|
| FIC_Segment () { | |
|   FIC_type | 2 |
|   Reserved | 5 |
|   error_indicator | 1 |
|   FIC_seg_number | 4 |
|   FIC_last_seg_number | 4 |
|   for (i=0;i<N;i++) { | |
|     data_byte | 8 |
|   } | |
| } | |

FIG. 16

| | Syntax | # of bits |
|---|---|---|
| A first region | if (FIC_seg_number == 0) { | |
| |   current_next_indicator | 1 |
| |   Reserved | 2 |
| |   ESG_version | 5 |
| |   transport_stream_id | 16 |
| | } | |
| A second region | while ( ensemble_id != 0xFF ) | |
| |   ensemble_id | 8 |
| |   reserved | 3 |
| |   SI_version | 5 |
| |   num_channel | 3 |
| A third region |   for (i=0;i< num_channel;i++) { | |
| |     channel_type | 5 |
| |     channel_activity | 2 |
| |     CA_indicator | 1 |
| |     Stand_alone_Service_indicator | |
| |     major_channel_num | 8 |
| |     minor_channel_num | 8 |
| |   } | |
| | } // end of while | |
| | } | |

FIG. 17

| Syntax | No. of Bits | Format |
|---|---|---|
| service_map_table_section() { | | |
|   table_id | 8 | TBD |
|   section_syntax_indicator | 1 | '0' |
|   private_indicator | 1 | '1' |
|   reserved | 2 | '11' |
|   section_length | 12 | uimsbf |
|   reserved | 3 | '111' |
|   version_number | 5 | uimsbf |
|   section_number | 8 | uimsbf |
|   last_section_number | 8 | uimsbf |
|   SMT_protocol_version | 8 | uimsbf |
|   ensemble_id | 8 | uimsbf |
|   num_channels | 8 | uimsbf |
|   for (i=0; i<num_channels; i++) | | |
|   { | | |
|     major_channel_number | 8 | uimsbf |
|     minor_channel_number | 8 | uimsbf |
|     short_channel_name | 8*8 | |
|     service_id | 16 | uimsbf |
|     service_type | 6 | uimsbf |
|     virtual_channel_activity | 2 | uimsbf |
|     num_components | 5 | uimsbf |
|     IP_version_flag | 1 | bslbf |
|     source_IP_address_flag | 1 | bslbf |
|     virtual_channel_target_IP_address_flag | 1 | bslbf |
|     if (source_IP_address_flag) | | |
|       source_IP_address | 32 or 128 | uimsbf |
|     if (virtual_channel_target_IP_address_flag) | | |
|       EMT_activity_flag | 32 or 128 | uimsbf |
|     for (j=0; j<num_components; j++) | | |
|     { | | |
|       RTP_payload_type | 7 | uimsbf |
|       component_target_IP_address_flag | 1 | bslbf |
|       if (component_target_IP_address_flag) | | |
|         component_target_IP_address | 32 or 128 | uimsbf |
|       reserved | 2 | '11' |
|       port_num_count | 6 | uimsbf |
|       target_UDP_port_num | 16 | uimsbf |
|       descriptors_length | 8 | uimsbf |
|       for (k=0; k<descriptors_length; k++) | | |
|       { | | |
|         component_level_descriptor() | | |
|       } | | |
|     } | | |
|     descriptors_length | 8 | uimsbf |
|     for (m=0; m<descriptors_length; m++) | | |
|     { | | uimsbf |
|       virtual_channel_level_descriptor() | | |
|     } | | |
|   } | | |
|   descriptors_length | 8 | |
|   for (n=0; n<descriptors_length; n++) { | | |
|   { | | |
|     ensemble_level_descriptor() | | |
|   } | | |
| } | | |

FIG. 18

| Syntax | No. of Bits | Format |
|---|---|---|
| MH_audio_descriptor() { | | |
|     descriptor_tag | 8 | TBD |
|     descriptor_length | 8 | uimsbf |
|     channel_configuration | 8 | uimsbf |
|     reserved | 5 | '11111' |
|     sample_rate_code | 3 | uimsbf |
|     reserved | 2 | '11' |
|     bit_rate_code | 6 | uimsbf |
|     ISO_639_language_code | 3*8 | uimsbf |
| } | | |

FIG. 19

| Syntax | No. of Bits | Format |
|---|---|---|
| MH_RTP_payload_type_descriptor() { | | |
|     descriptor_tag | 8 | TBD |
|     descriptor_length | 8 | uimsbf |
|     reserved | 1 | '1' |
|     RTP_payload_type | 7 | uimsbf |
|     MIME_type_length | 8 | uimsbf |
|     MIME_type() | var | |
| } | | |

FIG. 20

| Syntax | No. of Bits | Format |
|---|---|---|
| MH_current_event_descriptor() { | | |
|     descriptor_tag | 8 | TBD |
|     descriptor_length | 8 | uimsbf |
|     current_event_start_time | 4*8 | uimsbf |
|     current_event_duration | 3*8 | uimsbf |
|     Title_length | 8 | uimsbf |
|     Title_text() | var | |
| } | | |

FIG. 21

| Syntax | No. of Bits | Format |
|---|---|---|
| MH_next_event_descriptor() { | | |
|     descriptor_tag | 8 | TBD |
|     descriptor_length | 8 | uimsbf |
|     next_event_start_time | 4*8 | uimsbf |
|     next_event_duration | 3*8 | uimsbf |
|     title_length | 8 | uimsbf |
|     title_text() | var | |
| } | | |

FIG. 22

| Syntax | No. of Bits | Format |
|---|---|---|
| MH_system_time_descriptor() { | | |
|     descriptor_tag | 8 | TBD |
|     descriptor_length | 8 | uimsbf |
|     system_time | 32 | uimsbf |
|     GPS_UTC_offset | 8 | uimsbf |
|     time_zone_offset_polarity_rate_code | 1 | bslbf |
|     time_zone_offset | 31 | uimsbf |
|     daylight_savings() | 16 | uimsbf |
|     time_zone() | 5*8 | |
| } | | |

FIG. 25

| Syntax | No. of Bits | Format |
|---|---|---|
| extended_service_map_table_section() { | | |
|   table_id | 8 | TBD |
|   section_syntax_indicator | 1 | '0' |
|   Private_indicator | 1 | '1' |
|   reserved | 2 | '11' |
|   section_length | 12 | uimsbf |
|   transport_stream_id | 16 | uimsbf |
|   reserved | 2 | '111' |
|   version_number | 5 | uimsbf |
|   current_next_indicator | 1 | bslbf |
|   section_number | 8 | uimsbf |
|   last_section_number | 8 | uimsbf |
|   EMT_protocol_version | 8 | uimsbf |
|   ensemble_id | 8 | uimsbf |
|   num_channels | 8 | uimsbf |
|   for (i=0; i<num_channels; i++) | | |
|   { | | |
|     major_channel_number | 8 | uimsbf |
|     minor_channel_number | 8 | uimsbf |
|     num_components | 6 | uimsbf |
|     for (j=0; j<num_components; j++) | | |
|     { | | |
|       descriptors_length | 8 | uimsbf |
|       for (k=0; k<descriptor_length; k++) | | |
|       { | | |
|         component_level_descriptor() | | |
|       } | | |
|     } | | |
|     num_events | 8 | uimsbf |
|     for (j=0; j<num_events; j++) | | |
|     { | | |
|       descriptors_length | 8 | uimsbf |
|       for (k=0; k<descriptors_length; k++) | | |
|       { | | |
|         event_level_descriptor() | | |
|       } | | |
|     } | | |
|     descriptors_length | 8 | uimsbf |
|     for (m=0; m<descriptors_length; m++) | | |
|     { | | |
|       virtual_channel_level_descriptor() | | |
|     } | | |
|   } | | |
|   descriptors_length | 8 | uimsbf |
|   for (n=0; n<descriptors_length; n++) | | |
|   { | | |
|     ensemble_level_descriptor() | | |
|   } | | |
| } | | |

DIGITAL BROADCASTING SYSTEM AND METHOD OF PROCESSING DATA IN DIGITAL BROADCASTING SYSTEM

This application claims the benefit of U.S. Provisional Application No. 60/957,714, filed on Aug. 24, 2007, which is hereby incorporated by reference. Also, this application claims the benefit of U.S. Provisional Application No. 60/974,084, filed on Sep. 21, 2007, which is hereby incorporated by reference. This application also claims the benefit of U.S. Provisional Application No. 60/977,379, filed on Oct. 4, 2007, which is hereby incorporated by reference. This application also claims the benefit of U.S. Provisional Application No. 61/044,504, filed on Apr. 13, 2008, which is hereby incorporated by reference. This application also claims the benefit of U.S. Provisional Application No. 61/076,686, filed on Jun. 29, 2008, which is hereby incorporated by reference. This application also claims the priority benefit of Korean Application No. 10-2008-0082582, filed on Aug. 22, 2008, which is hereby incorporated by reference.

BACKGROUND OF THE INVENTION

1. Field of the Invention

The present invention relates to a digital broadcasting system, and more particularly, to a digital broadcasting system and a data processing method.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

An object of the present invention is to provide a digital broadcasting system and a data processing method that are highly resistant to channel changes and noise. An object of the present invention is to provide a digital broadcasting system and a method of processing data in a digital broadcasting system that can enhance the receiving performance of a receiving system (or receiver) by having a transmitting system (or transmitter) perform additional encoding on mobile service data. Another object of the present invention is to provide a digital broadcasting system and a method of processing data in the digital broadcasting system that can also enhance the receiving performance of a digital broadcast receiving system by inserting known data already known in accordance with a pre-agreement between the receiving system and the transmitting system in a predetermined region within a data region.

Another object of the present invention is to provide a digital broadcasting system and a method of processing data in the digital broadcasting system that can provide an additional service of the mobile service data, when a broadcasting signal in which the main service data are multiplexed with the mobile service data, is transmitted.

To achieve the objects, the present invention provides a data processing method. The data processing method includes receiving a broadcasting signal where mobile service data are multiplexed with main service data, extracting transmission-parameter-channel signaling information and fast-information-channel signaling information from a data group within the received mobile service data, obtaining first program table information describing virtual channel information of an ensemble and a service provided by the ensemble using the fast-information-channel signaling information, the ensemble corresponding to a virtual channel group of the received mobile service data, obtaining information indicating that second program table information, which describes an additional service provided by the ensemble, is included in the ensemblem and parsing the second program table information according to the obtained information and providing the additional service by using the second program table information.

The second program table information includes at least one of a component level descriptor describing a component in the ensemble, an event level descriptor describing an event in a virtual channel in the ensemble, a virtual channel level descriptor, and an ensemble level descriptor.

In another aspect of the present invention to achieve the objects, the present invention provides a digital broadcasting system. The digital broadcasting system includes a baseband processor configured to receive a broadcasting signal where mobile service data are multiplexed with main service data, and extract transmission-parameter-channel signaling information and fast-information-channel signaling information from a data group within the received mobile service data, a management processor configured to obtain first program table information describing virtual channel information of an ensemble and a service provided by the ensemble using the fast-information-channel signaling information, the ensemble corresponding to a virtual channel group of the received mobile service data, and parse information indicating that second program table information, which describes an additional service provided by the ensemble, is included in the ensemblem and parse the second program table information according to the obtained information; and a presentation processor configured to provide the additional service by using the second program table information.

The management processor includes a service information handler configure to parse the first program table information and the second program table information; and a storage unit configure to store the information parsed by the service information handler.

The presentation processor includes a presentation controller configured to read the additional service information stored in the storage unit, and a display module configured to display the read the information on the additional service.

The data group includes a plurality of known data sequences, and the transmission-parameter-channel signaling information and the fast-information-channel signaling information are located between the first known data sequence and the second known data sequence of the known data sequences

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 15 illustrates an exemplary bit stream syntax structure with respect to an FIC segment according to an embodiment of the present invention;

FIG. 16 illustrates an exemplary bit stream syntax structure with respect to a payload of an FIC segment according to the present invention, when an FIC type field value is equal to '0';

FIG. 17 illustrates an exemplary bit stream syntax structure of a service map table according to the present invention;

FIG. 18 illustrates an exemplary bit stream syntax structure of an MH audio descriptor according to the present invention;

FIG. 19 illustrates an exemplary bit stream syntax structure of an MH RTP payload type descriptor according to the present invention;

FIG. 20 illustrates an exemplary bit stream syntax structure of an MH current event descriptor according to the present invention;

FIG. 21 illustrates an exemplary bit stream syntax structure of an MH next event descriptor according to the present invention;

FIG. 22 illustrates an exemplary bit stream syntax structure of an MH system time descriptor according to the present invention;

FIG. 25 illustrates an exemplary bit stream syntax structure of an EMT according to another embodiment of the present invention.

DETAILED DESCRIPTION OF THE INVENTION

Figure 1:
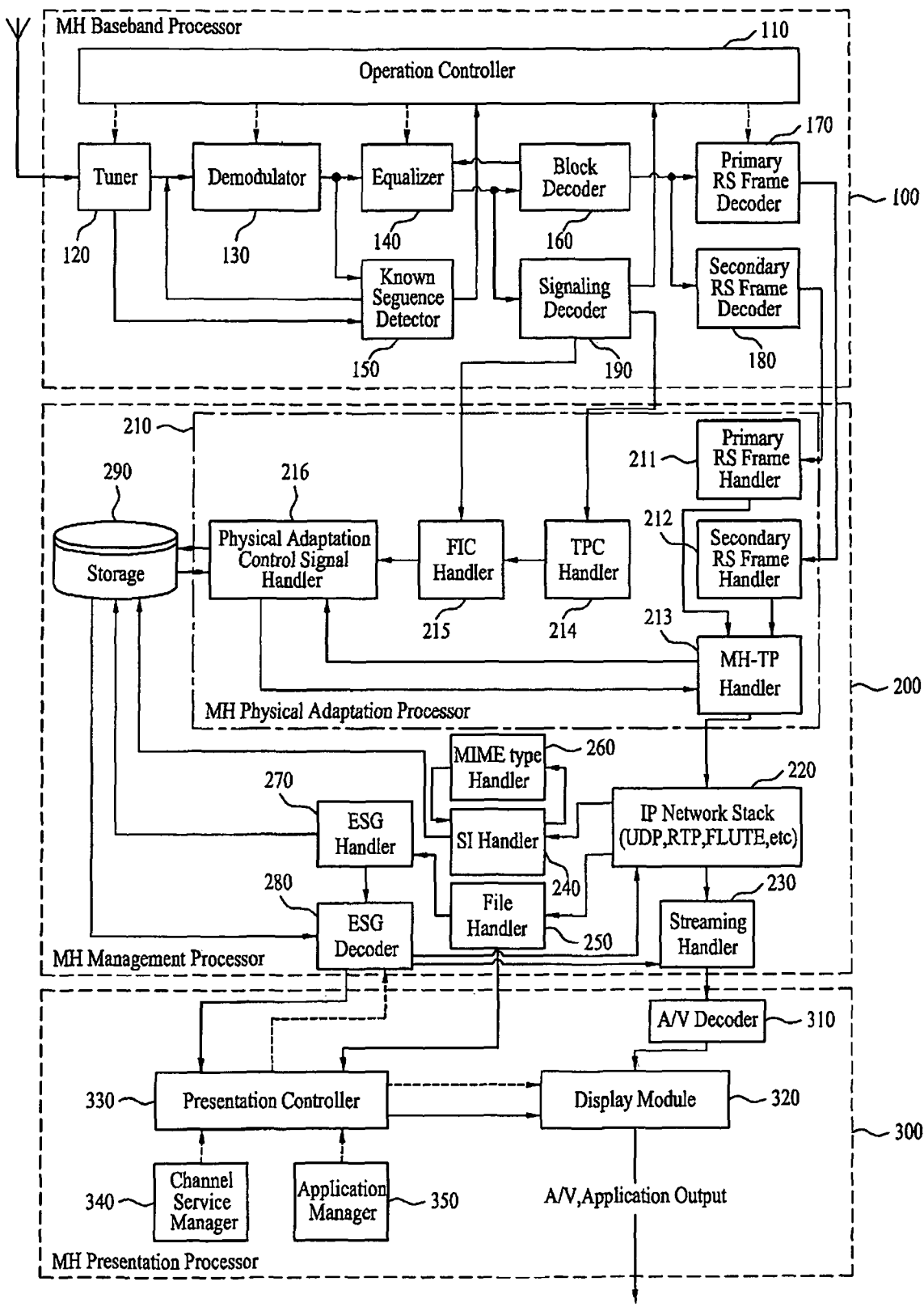
FIG. 1 illustrates a block diagram showing a general structure of a digital broadcasting receiving system according to an embodiment of the present invention.

Reference will now be made in detail to the preferred embodiments of the present invention, examples of which are illustrated in the accompanying drawings. And, the structures and operation of the present invention explained by the referred figures are embodiments, the technical concept and its core structure and operation is not limited by the embodiments.

The Definition of the Terms Used in the Present Invention

Although general terms, which are widely used considering functions in the present invention, have been selected in the present invention, they may be changed depending on intention of those skilled in the art, practices, or new technology. Also, in specific case, the applicant may optionally select the terms. In this case, the meaning of the terms will be described in detail in the description part of the invention. Therefore, it is to be understood that the terms should be defined based upon their meaning not their simple title and the whole description of the present invention.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, among the terms used in the present invention, "MH" corresponds to the initials of "mobile" and "handheld" and represents the opposite concept of a fixed-type system. Furthermore, the MH service data may include at least one of mobile service data and handheld service data, and will also be referred to as "mobile service data" for simplicity. Herein, the mobile service data not only correspond to MH service data but may also include any type of service data with mobile or portable characteristics. Therefore, the mobile service data according to the present invention are not limited only to the MH service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

In the present invention, the transmitting system provides backward compatibility in the main service data so as to be received by the conventional receiving system. Herein, the main service data and the mobile service data are multiplexed to the same physical channel and then transmitted.

Furthermore, the digital broadcast transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Receiving System

FIG. 1 illustrates a block diagram showing a general structure of a digital broadcasting receiving system according to an embodiment of the present invention.

The digital broadcast receiving system according to the present invention includes a baseband processor 100, a management processor 200, and a presentation processor 300.

The baseband processor 100 includes an operation controller 110, a tuner 120, a demodulator 130, an equalizer 140, a known sequence detector (or known data detector) 150, a block decoder (or mobile handheld block decoder) 160, a promary Reed-Solomon (RS) frame decoder 170, a secondary RS frame decoder 180, and a signaling decoder 190.

The operation controller 110 controls the operation of each block included in the baseband processor 100.

By tuning the receiving system to a specific physical channel frequency, the tuner 120 enables the receiving system to receive main service data, which correspond to broadcast signals for fixed-type broadcast receiving systems, and mobile service data, which correspond to broadcast signals for mobile broadcast receiving systems. At this point, the tuned frequency of the specific physical channel is down-converted to an intermediate frequency (IF) signal, thereby being outputted to the demodulator 130 and the known sequence detector 140. The passband digital IF signal being outputted from the tuner 120 may only include main service data, or only include mobile service data, or include both main service data and mobile service data.

The demodulator 130 performs self-gain control, carrier wave recovery, and timing recovery processes on the passband digital IF signal inputted from the tuner 120, thereby modifying the IF signal to a baseband signal. Then, the demodulator 130 outputs the baseband signal to the equalizer 140 and the known sequence detector 150. The demodulator 130 uses the known data symbol sequence inputted from the known sequence detector 150 during the timing and/or carrier wave recovery, thereby enhancing the demodulating performance.

The equalizer 140 compensates channel-associated distortion included in the signal demodulated by the demodulator 130. Then, the equalizer 140 outputs the distortion-compensated signal to the block decoder 160. By using a known data symbol sequence inputted from the known sequence detector 150, the equalizer 140 may enhance the equalizing performance. Furthermore, the equalizer 140 may receive feedback on the decoding result from the block decoder 160, thereby enhancing the equalizing performance.

The known sequence detector 150 detects known data place (or position) inserted by the transmitting system from the input/output data (i.e., data prior to being demodulated or data being processed with partial demodulation). Then, the known sequence detector 150 outputs the detected known data position information and known data sequence generated from the detected position information to the demodulator 130 and the equalizer 140. Additionally, in order to allow the block decoder 160 to identify the mobile service data that have been processed with additional encoding by the transmitting system and the main service data that have not been processed with any additional encoding, the known sequence detector 150 outputs such corresponding information to the block decoder 160.

If the data channel-equalized by the equalizer 140 and inputted to the block decoder 160 correspond to data processed with both block-encoding and trellis-encoding by the transmitting system (i.e., data within the RS frame, signaling data), the block decoder 160 may perform trellis-decoding and block-decoding as inverse processes of the transmitting system. On the other hand, if the data channel-equalized by the equalizer 140 and inputted to the block decoder 160 correspond to data processed only with trellis-encoding and not block-encoding by the transmitting system (i.e., main service data), the block decoder 160 may perform only trellis-decoding.

The signaling decoder 190 decoded signaling data that have been channel-equalized and inputted from the equalizer 140. It is assumed that the signaling data inputted to the signaling decoder 190 correspond to data processed with both block-encoding and trellis-encoding by the transmitting system. Examples of such signaling data may include transmission parameter channel (TPC) data and fast information channel (FIC) data. Each type of data will be described in more detail in a later process. The FIC data decoded by the signaling decoder 190 are outputted to the FIC handler 215. And, the TPC data decoded by the signaling decoder 190 are outputted to the TPC handler 214.

Meanwhile, according to the present invention, the transmitting system uses RS frames by encoding units. Herein, the RS frame may be divided into a primary RS frame and a secondary RS frame. However, according to the embodiment of the present invention, the primary RS frame and the secondary RS frame will be divided based upon the level of importance of the corresponding data. The primary RS frame decoder 170 receives the data outputted from the block decoder 160. At this point, according to the embodiment of the present invention, the primary RS frame decoder 170 receives only the mobile service data that have been Reed-Solomon (RS)-encoded and/or cyclic redundancy check (CRC)-encoded from the block decoder 160.

Herein, the primary RS frame decoder 170 receives only the mobile service data and not the main service data. The primary RS frame decoder 170 performs inverse processes of an RS frame encoder (not shown) included in the digital broadcast transmitting system, thereby correcting errors existing within the primary RS frame. More specifically, the primary RS frame decoder 170 forms a primary RS frame by grouping a plurality of data groups and, then, correct errors in primary RS frame units. In other words, the primary RS frame decoder 170 decodes primary RS frames, which are being transmitted for actual broadcast services.

Additionally, the secondary RS frame decoder 180 receives the data outputted from the block decoder 160. At this point, according to the embodiment of the present invention, the secondary RS frame decoder 180 receives only the mobile service data that have been RS-encoded and/or CRC-encoded from the block decoder 160. Herein, the secondary RS frame decoder 180 receives only the mobile service data and not the main service data. The secondary RS frame decoder 180 performs inverse processes of an RS frame encoder (not shown) included in the digital broadcast transmitting system, thereby correcting errors existing within the secondary RS frame. More specifically, the secondary RS frame decoder 180 forms a secondary RS frame by grouping a plurality of data groups and, then, correct errors in secondary RS frame units. In other words, the secondary RS frame decoder 180 decodes secondary RS frames, which are being transmitted for mobile audio service data, mobile video service data, guide data, and so on.

Meanwhile, the management processor 200 according to an embodiment of the present invention includes an MH physical adaptation processor 210, an IP network stack 220, a streaming handler 230, a system information (SI) handler 240, a file handler 250, a multi-purpose internet main extensions (MIME) type handler 260, and an electronic service guide (ESG) handler 270, and an ESG decoder 280, and a storage unit 290.

The MH physical adaptation processor 210 includes a primary RS frame handler 211, a secondary RS frame handler 212, an MH transport packet (TP) handler 213, a TPC handler 214, an FIC handler 215, and a physical adaptation control signal handler 216.

The TPC handler 214 receives and processes baseband information required by modules corresponding to the MH physical adaptation processor 210. The baseband information is inputted in the form of TPC data. Herein, the TPC handler 214 uses this information to process the FIC data, which have been sent from the baseband processor 100.

The TPC data are transmitted from the transmitting system to the receiving system via a predetermined region of a data group. The TPC data may include at least one of an MH ensemble ID, an MH sub-frame number, a total number of MH groups (TNoG), an RS frame continuity counter, a column size of RS frame (N), and an FIC version number.

Herein, the MH ensemble ID indicates an identification number of each MH ensemble carried in the corresponding channel.

The MH sub-frame number signifies a number identifying the MH sub-frame number in an MH frame, wherein each MH group associated with the corresponding MH ensemble is transmitted.

The TNoG represents the total number of MH groups including all of the MH groups belonging to all MH parades included in an MH sub-frame.

The RS frame continuity counter indicates a number that serves as a continuity counter of the RS frames carrying the corresponding MH ensemble. Herein, the value of the RS frame continuity counter shall be incremented by 1 modulo 16 for each successive RS frame.

N represents the column size of an RS frame belonging to the corresponding MH ensemble. Herein, the value of N determines the size of each MH TP.

Finally, the FIC version number signifies the version number of an FIC body carried on the corresponding physical channel.

As described above, diverse TPC data are inputted to the TPC handler 214 via the signaling decoder 190 shown in FIG. 1. Then, the received TPC data are processed by the TPC handler 214. The received TPC data may also be used by the FIC handler 215 in order to process the FIC data.

The FIC handler 215 processes the FIC data by associating the FIC data received from the baseband processor 100 with the TPC data.

The physical adaptation control signal handler 216 collects FIC data received through the FIC handler 215 and SI data received through RS frames. Then, the physical adaptation control signal handler 216 uses the collected FIC data and SI data to configure and process IP datagrams and access information of mobile broadcast services. Thereafter, the physical adaptation control signal handler 216 stores the processed IP datagrams and access information to the storage unit 290.

The primary RS frame handler 211 identifies primary RS frames received from the primary RS frame decoder 170 of the baseband processor 100 for each row unit, so as to configure an MH TP. Thereafter, the primary RS frame handler 211 outputs the configured MH TP to the MH TP handler 213.

The secondary RS frame handler 212 identifies secondary RS frames received from the secondary RS frame decoder 180 of the baseband processor 100 for each row unit, so as to configure an MH TP. Thereafter, the secondary RS frame handler 212 outputs the configured MH TP to the MH TP handler 213.

The MH transport packet (TP) handler 213 extracts a header from each MH TP received from the primary RS frame handler 211 and the secondary RS frame handler 212, thereby determining the data included in the corresponding MH TP. Then, when the determined data correspond to SI data (i.e., SI data that are not encapsulated to IP datagrams), the corresponding data are outputted to the physical adaptation control signal handler 216. Alternatively, when the determined data correspond to an IP datagram, the corresponding data are outputted to the IP network stack 220.

The IP network stack 220 processes broadcast data that are being transmitted in the form of IP datagrams. More specifically, the IP network stack 220 processes data that are inputted via user datagram protocol (UDP), real-time transport protocol (RTP), real-time transport control protocol (RTCP), asynchronous layered coding/layered coding transport (ALC/LCT), file delivery over unidirectional transport (FLUTE), and so on. Herein, when the processed data correspond to streaming data, the corresponding data are outputted to the streaming handler 230. And, when the processed data correspond to data in a file format, the corresponding data are outputted to the file handler 250. Finally, when the processed data correspond to SI-associated data, the corresponding data are outputted to the SI handler 240.

The SI handler 240 receives and processes SI data having the form of IP datagrams, which are inputted to the IP network stack 220.

When the inputted data associated with SI correspond to MIME-type data, the inputted data are outputted to the MIME-type handler 260.

The MIME-type handler 260 receives the MIME-type SI data outputted from the SI handler 240 and processes the received MIME-type SI data.

The file handler 250 receives data from the IP network stack 220 in an object format in accordance with the ALC/LCT and FLUTE structures. The file handler 250 groups the received data to create a file format. Herein, when the corresponding file includes ESG, the file is outputted to the ESG handler 270. On the other hand, when the corresponding file includes data for other file-based services, the file is outputted to the presentation controller 330 of the presentation processor 300.

The ESG handler 270 processes the ESG data received from the file handler 250 and stores the processed ESG data to the storage unit 290. Alternatively, the ESG handler 270 may output the processed ESG data to the ESG decoder 280, thereby allowing the ESG data to be used by the ESG decoder 280.

The storage unit 290 stores the system information (SI) received from the physical adaptation control signal handler 210 and the ESG handler 270 therein. Thereafter, the storage unit 290 transmits the stored SI data to each block.

The ESG decoder 280 either recovers the ESG data and SI data stored in the storage unit 290 or recovers the ESG data transmitted from the ESG handler 270. Then, the ESG decoder 280 outputs the recovered data to the presentation controller 330 in a format that can be outputted to the user.

The streaming handler 230 receives data from the IP network stack 220, wherein the format of the received data are in accordance with RTP and/or RTCP structures. The streaming handler 230 extracts audio/video streams from the received data, which are then outputted to the audio/video (A/V) decoder 310 of the presentation processor 300. The audio/video decoder 310 then decodes each of the audio stream and video stream received from the streaming handler 230.

The display module 320 of the presentation processor 300 receives audio and video signals respectively decoded by the A/V decoder 310. Then, the display module 320 provides the received audio and video signals to the user through a speaker and/or a screen.

The presentation controller 330 corresponds to a controller managing modules that output data received by the receiving system to the user.

The channel service manager 340 manages an interface with the user, which enables the user to use channel-based broadcast services, such as channel map management, channel service connection, and so on.

The application manager 350 manages an interface with a user using ESG display or other application services that do not correspond to channel-based services.

Data Format Structure

Meanwhile, the data structure used in the mobile broadcasting technology according to the embodiment of the present invention may include a data group structure and an RS frame structure, which will now be described in detail.

Figure 2:
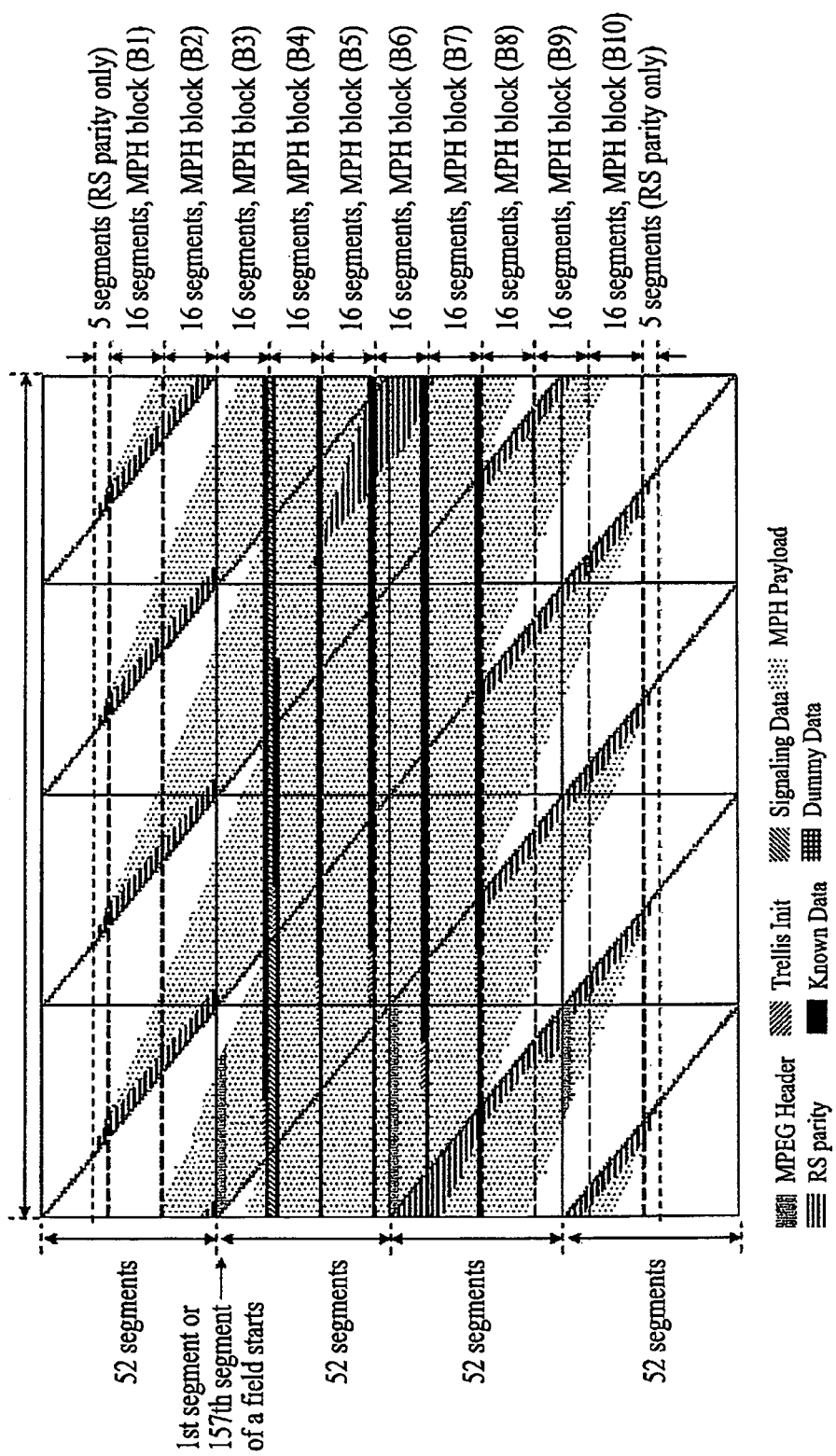
FIG. 2 illustrates an exemplary structure of a data group according to the present invention.

FIG. 2 illustrates an exemplary structure of a data group according to the present invention.

FIG. 2 shows an example of dividing a data group according to the data structure of the present invention into 10 MH blocks (i.e., MH block 1 (B1) to MH block 10 (B10)). In this example, each MH block has the length of 16 segments. Referring to FIG. 2, only the RS parity data are allocated to portions of the first 5 segments of the MH block 1 (B1) and the last 5 segments of the MH block 10 (B10). The RS parity data are excluded in regions A to D of the data group.

More specifically, when it is assumed that one data group is divided into regions A, B, C, and D, each MH block may be included in any one of region A to region D depending upon the characteristic of each MH block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 2, MH block 4 (B4) to MH block 7 (B7) correspond to regions without interference of the main service data. MH block 4 (B4) to MH block 7 (B7) within the data group shown in FIG. 2 correspond to a region where no interference from the main service data occurs. In this example, a long known data sequence is inserted at both the beginning and end of each MH block. In the description of the present invention, the region including MH block 4 (B4) to MH block 7 (B7) will be referred to as "region A (=B4+B5+B6+B7)". As described above, when the data group includes region A having a long known data sequence inserted at both the beginning and end of each MH block, the receiving system is capable of performing equalization by using the channel information that can be obtained from the known data. Therefore, the strongest equalizing performance may be yielded (or obtained) from one of region A to region D.

In the example of the data group shown in FIG. 2, MH block 3 (B3) and MH block 8 (B8) correspond to a region having little interference from the main service data. Herein, a long known data sequence is inserted in only one side of each MH block B3 and B8. More specifically, due to the interference from the main service data, a long known data sequence is inserted at the end of MH block 3 (B3), and another long known data sequence is inserted at the beginning of MH block 8 (B8). In the present invention, the region including MH block 3 (B3) and MH block 8 (B8) will be referred to as "region B (=B3+B8)". As described above, when the data group includes region B having a long known data sequence inserted at only one side (beginning or end) of each MH block, the receiving system is capable of performing equalization by using the channel information that can be obtained from the known data. Therefore, a stronger equalizing performance as compared to region C/D may be yielded (or obtained).

Referring to FIG. 2, MH block 2 (B2) and MH block 9 (B9) correspond to a region having more interference from the main service data as compared to region B. A long known data sequence cannot be inserted in any side of MH block 2 (B2) and MH block 9 (B9). Herein, the region including MH block 2 (B2) and MH block 9 (B9) will be referred to as "region C (=B2+B9)".

Finally, in the example shown in FIG. 2, MH block 1 (B1) and MH block 10 (B10) correspond to a region having more interference from the main service data as compared to region C. Similarly, a long known data sequence cannot be inserted in any side of MH block 1 (B1) and MH block 10 (B10). Herein, the region including MH block 1 (B1) and MH block 10 (B10) will be referred to as "region D (=B1+B10)". Since region C/D is spaced further apart from the known data sequence, when the channel environment undergoes frequent and abrupt changes, the receiving performance of region C/D may be deteriorated.

Additionally, the data group includes a signaling information area wherein signaling information is assigned (or allocated).

In the present invention, the signaling information area may start from the $1^{st}$ segment of the $4^{th}$ MH block (B4) to a portion of the $2^{nd}$ segment. According to an embodiment of the present invention, the signaling information area for inserting signaling information may start from the $1^{st}$ segment of the $4^{th}$ MH block (B4) to a portion of the $2^{nd}$ segment. More specifically, 276(=207+69) bytes of the $4^{th}$ MH block (B4) in each data group are assigned as the signaling information area. In other words, the signaling information area consists of 207 bytes of the $1^{st}$ segment and the first 69 bytes of the $2^{nd}$ segment of the $4^{th}$ MH block (B4). The $1^{st}$ segment of the $4^{th}$ MH block (B4) corresponds to the $17^{th}$ or $173^{rd}$ segment of a VSB field.

Herein, the signaling information may be identified by two different types of signaling channels: a transmission parameter channel (TPC) and a fast information channel (FIC).

Herein, the TPC data may include at least one of an MH ensemble ID, an MH sub-frame number, a total number of MH groups (TNoG), an RS frame continuity counter, a column size of RS frame (N), and an FIC version number. However, the TPC data (or information) presented herein are merely exemplary. And, since the adding or deleting of signaling information included in the TPC data may be easily adjusted and modified by one skilled in the art, the present invention will, therefore, not be limited to the examples set forth herein. Furthermore, the FIC is provided to enable a fast service acquisition of data receivers, and the FIC includes cross layer information between the physical layer and the upper layer(s).

For example, when the data group includes 6 known data sequences, as shown in FIG. 2, the signaling information area is located between the first known data sequence and the second known data sequence. More specifically, the first known data sequence is inserted in the last 2 segments of the $3^{rd}$ MH block (B3), and the second known data sequence in inserted in the $2^{nd}$ and $3^{rd}$ segments of the $4^{th}$ MH block (B4). Furthermore, the $3^{rd}$ to $6^{th}$ known data sequences are respectively inserted in the last 2 segments of each of the $4^{th}$, $5^{th}$, $6^{th}$, and $7^{th}$ MH blocks (B4, B5, B6, and B7). The $1^{st}$ and $3^{rd}$ to $6^{th}$ known data sequences are spaced apart by 16 segments.

Figure 3:
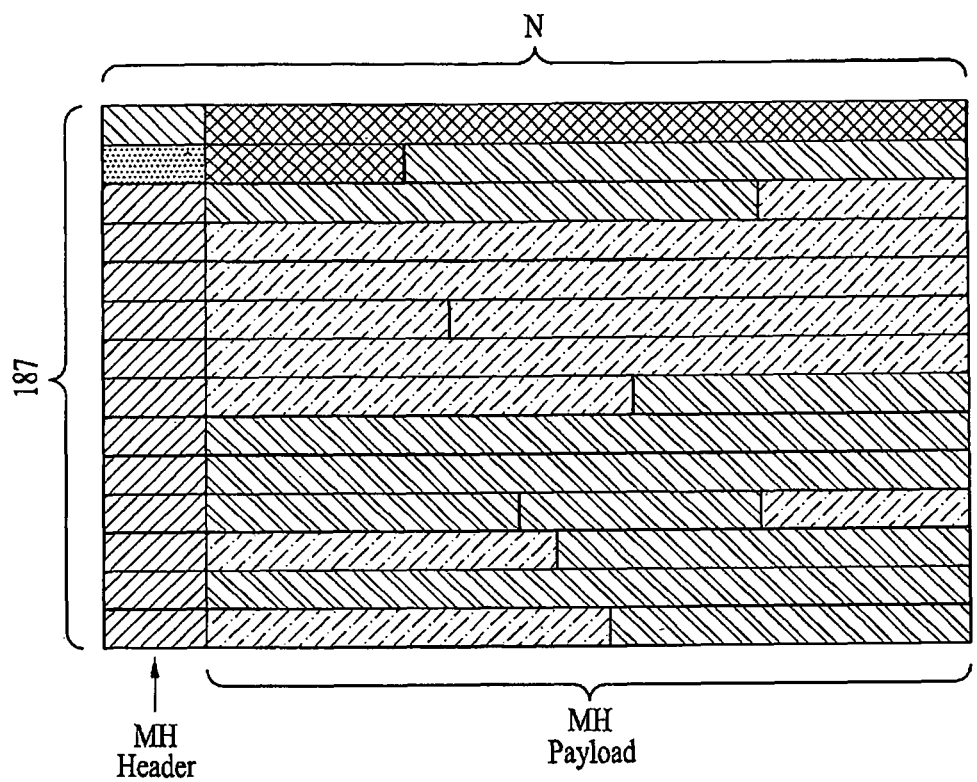
FIG. 3 illustrates an RS frame according to an embodiment of the present invention.

FIG. 3 illustrates an RS frame according to an embodiment of the present invention.

The RS frame shown in FIG. 3 corresponds to a collection of one or more data groups. The RS frame is received for each MH frame in a condition where the receiving system receives the FIC and processes the received FIC and where the receiving system is switched to a time-slicing mode so that the receiving system can receive MH ensembles including ESG entry points. Each RS frame includes IP streams of each service or ESG, and SMT section data may exist in all RS frames.

The RS frame according to the embodiment of the present invention consists of at least one MH transport packet (TP). Herein, the MH TP includes an MH header and an MH payload.

The MH payload may include mobile service data as well as signaling data. More specifically, an MH payload may include only mobile service data, or may include only signaling data, or may include both mobile service data and signaling data.

According to the embodiment of the present invention, the MH header may identify (or distinguish) the data types included in the MH payload. More specifically, when the MH TP includes a first MH header, this indicates that the MH payload includes only the signaling data. Also, when the MH TP includes a second MH header, this indicates that the MH payload includes both the signaling data and the mobile service data. Finally, when MH TP includes a third MH header, this indicates that the MH payload includes only the mobile service data.

In the example shown in FIG. 3, the RS frame is assigned with IP datagrams (IP datagram 1 and IP datagram 2) for two service types.

Data Transmission Structure

Figure 4:
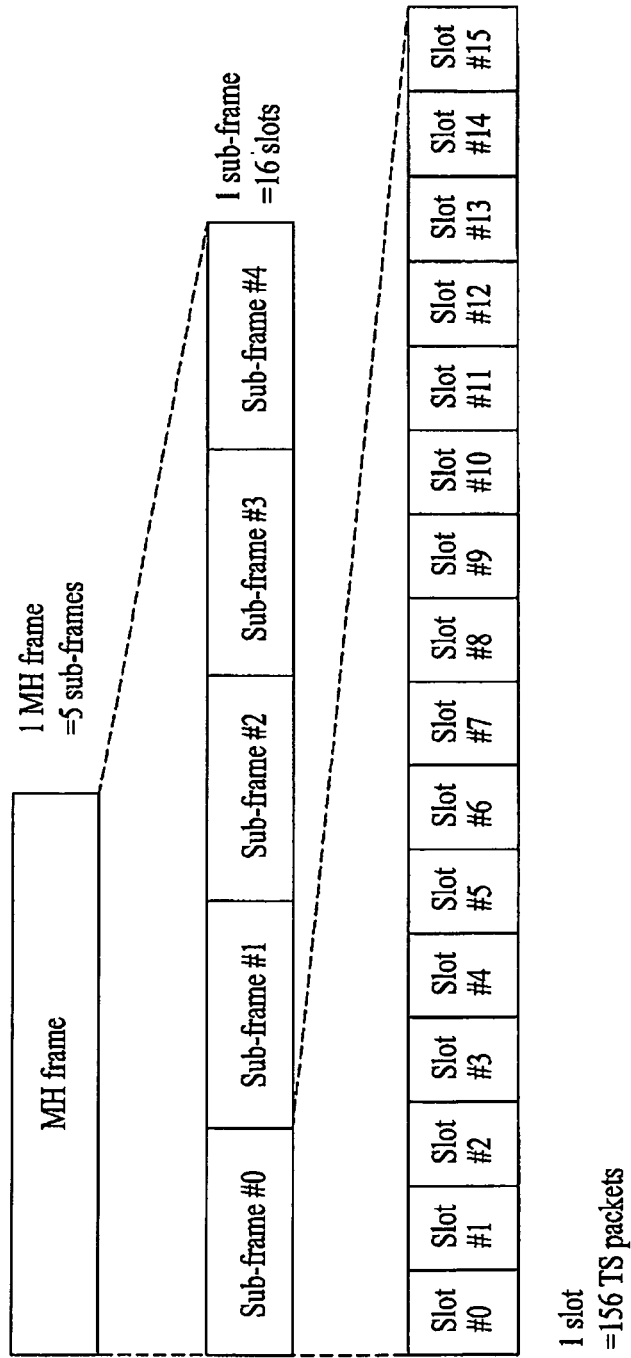
FIG. 4 illustrates an example of an MH frame structure for transmitting and receiving mobile service data according to the present invention.

FIG. 4 illustrates a structure of a MH frame for transmitting and receiving mobile service data according to the present invention.

In the example shown in FIG. 4, one MH frame consists of 5 sub-frames, wherein each sub-frame includes 16 slots. In this case, the MH frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 5:
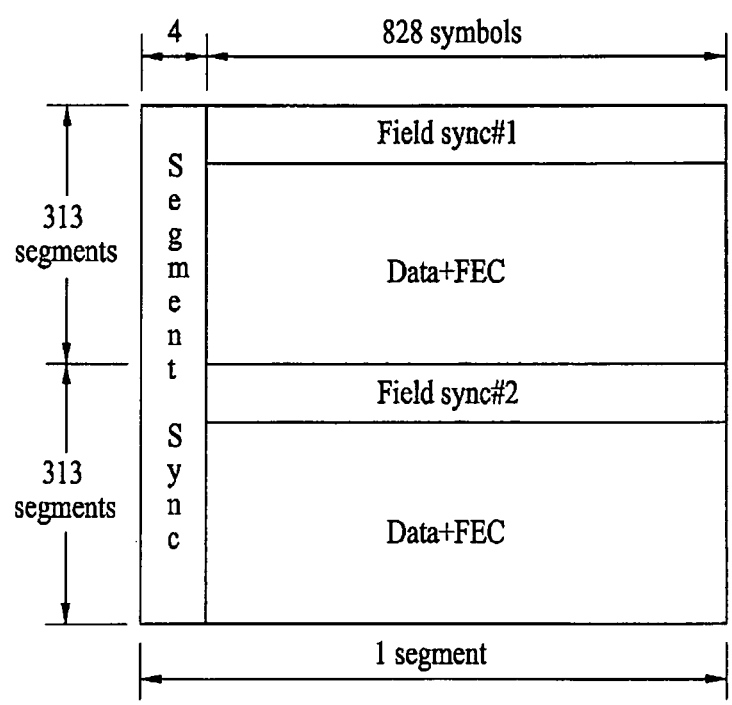
FIG. 5 illustrates an example of a general VSB frame structure.

FIG. 5 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time unit for multiplexing the mobile service data and the main service data. Herein, one slot may either include the mobile service data or be configured only of the main service data.

If the first 118 data packets within the slot correspond to a data group, the remaining 38 data packets become the main service data packets. In another example, when no data group exists in a slot, the corresponding slot is configured of 156 main service data packets.

Meanwhile, when the slots are assigned to a VSB frame, an off-set exists for each assigned position.

Figure 6:
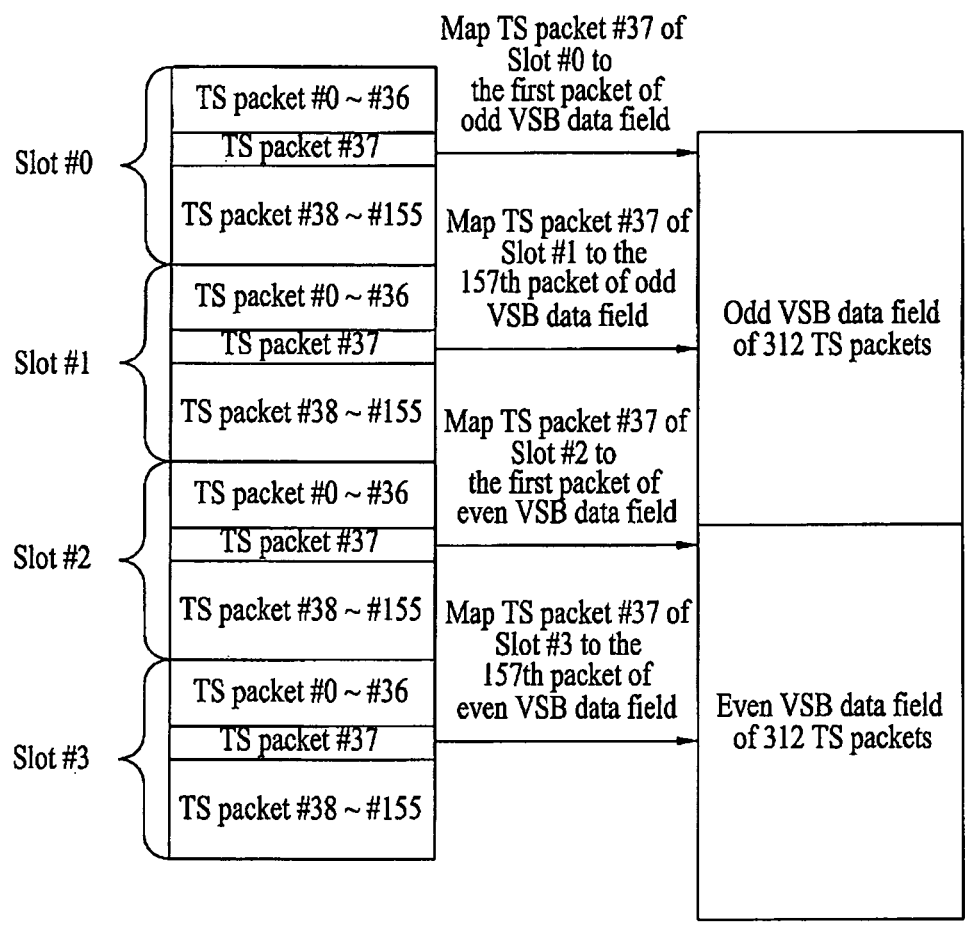
FIG. 6 illustrates a example of mapping positions of the first 4 slots of a sub-frame in a spatial area with respect to a VSB frame.

FIG. 6 illustrates a mapping example of the positions to which the first 4 slots of a sub-frame are assigned with respect to a VSB frame in a spatial area. And, FIG. 7 illustrates a mapping example of the positions to which the first 4 slots of a sub-frame are assigned with respect to a VSB frame in a chronological (or time) area.

Figure 7:
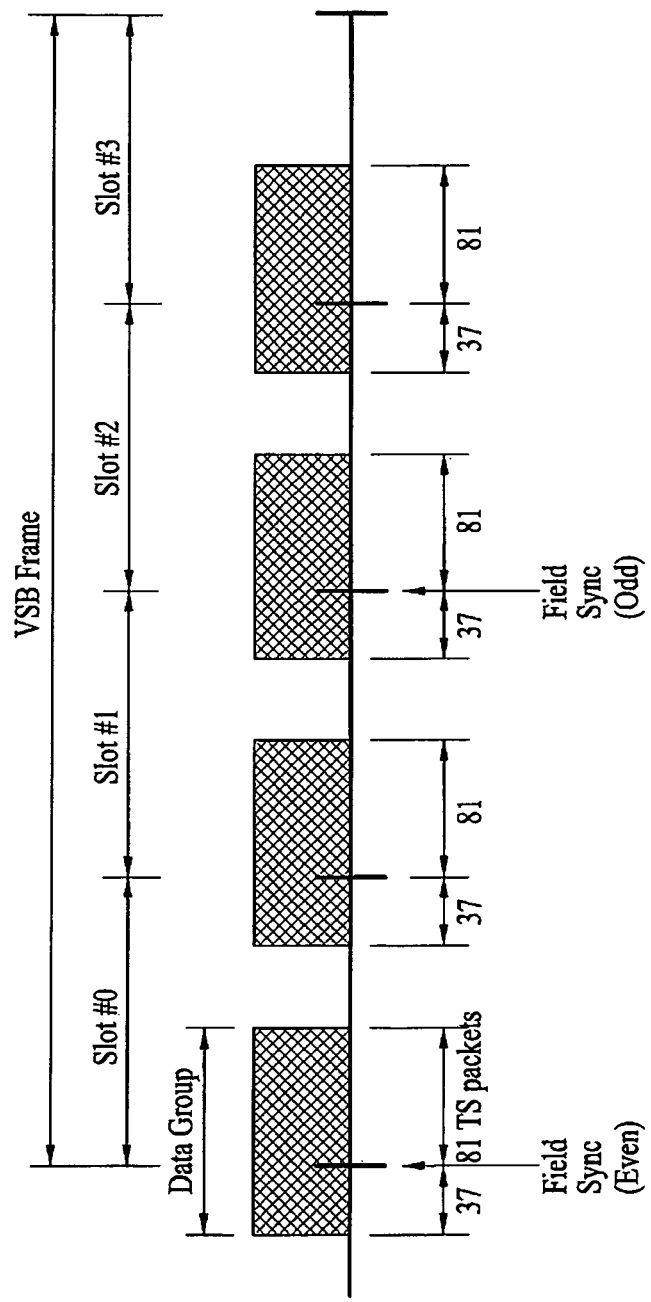
FIG. 7 illustrates a example of mapping positions of the first 4 slots of a sub-frame in a chronological (or time) area with respect to a VSB frame.

Referring to FIG. 6 and FIG. 7, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Figure 8:
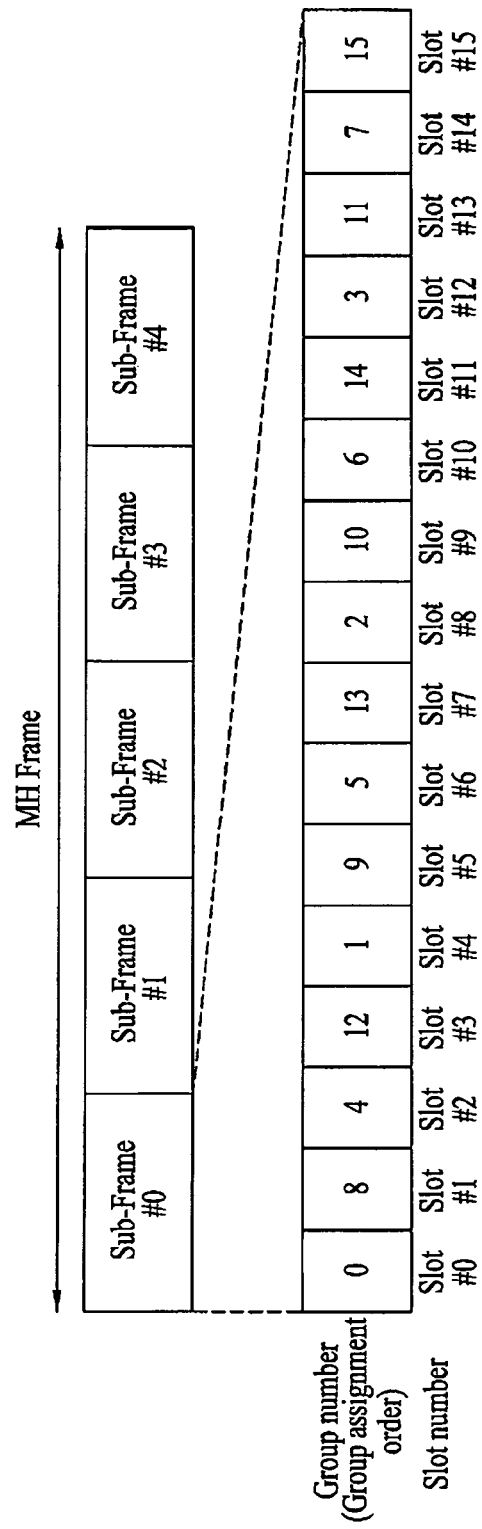
FIG. 8 illustrates an exemplary order of data MH frame according to the present invention.

FIG. 8 illustrates an exemplary assignment order of data groups being assigned to one of 5 sub-frames, wherein the 5 sub-frames configure an MH frame. For example, the method of assigning data groups may be identically applied to all MH frames or differently applied to each MH frame. Furthermore, the method of assigning data groups may be identically applied to all sub-frames or differently applied to each sub-frame. At this point, when it is assumed that the data groups are assigned using the same method in all sub-frames of the corresponding MH frame, the total number of data groups being assigned to an MH frame is equal to a multiple of '5'.

According to the embodiment of the present invention, a plurality of consecutive data groups is assigned to be spaced as far apart from one another as possible within the MH frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 8 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15.

Equation 1 below shows the above-described rule (or pattern) for assigning data groups in a sub-frame.

$j=(4i+0)\bmod 16$ $0=0$ if $i<4$,

Herein, $0=2$ else if $i<8$, $0=1$ else if $i<12$, $0=3$ else.     (1)

Herein, j indicates the slot number within a sub-frame. The value of j may range from 0 to 15 (i.e., $0\leq j\leq 15$). Also, variable i indicates the data group number. The value of i may range from 0 to 15 (i.e., $0\leq i\leq 15$).

In the present invention, a collection of data groups included in a MH frame will be referred to as a "parade". Based upon the RS frame mode, the parade transmits data of at least one specific RS frame.

The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

According to the embodiment of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. Conversely, when the mobile service data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Such RS frame mode is transmitted as the above-described TPC data. Table 1 below shows an example of the RS frame mode.

TABLE 1

| RS frame mode (2 bits) | Description |
|---|---|
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame. Furthermore, the method of assigning parades may be identically applied to all MH frames or differently applied to each MH frame. According to the embodiment of the present invention, the parades may be assigned differently for each MH frame and identically for all sub-frames within an MH frame. More specifically, the MH frame structure may vary by MH frame units. Thus, an ensemble rate may be adjusted on a more frequent and flexible basis.

Figure 9:
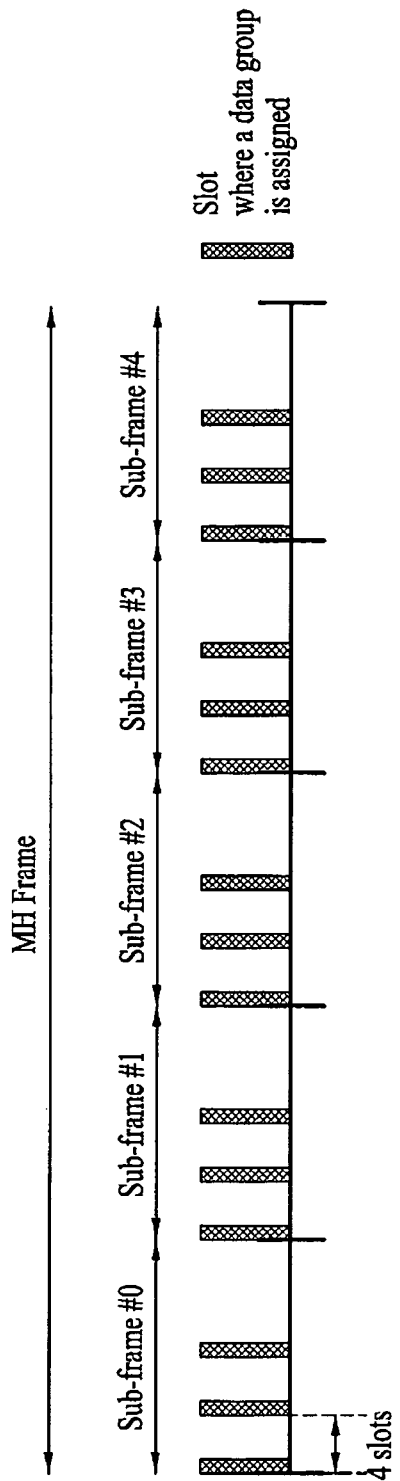
FIG. 9 illustrates an example of a single parade being assigned to an MH frame according to the present invention.

FIG. 9 illustrates an example of multiple data groups of a single parade being assigned (or allocated) to an MH frame. More specifically, FIG. 9 illustrates an example of a plurality of data groups included in a single parade, wherein the number of data groups included in a sub-frame is equal to '3', being allocated to an MH frame. Referring to FIG. 9, 3 data groups are sequentially assigned to a sub-frame at a cycle period of 4 slots. Accordingly, when this process is equally performed in the 5 sub-frames included in the corresponding MH frame, 15 data groups are assigned to a single MH frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder (not shown) included in the transmitting system performs RS-encoding on the corresponding RS frame, thereby adding 24 bytes of parity data to the corresponding RS frame and transmitting the processed RS frame, the parity data occupy approximately 11.37% ($=24/(187+24)\times 100$) of the total code word length. Meanwhile, when one sub-frame includes 3 data groups, and when the data groups included in the parade are assigned, as shown in FIG. 9, a total of 15 data groups form an RS frame. Accordingly, even when an error occurs in an entire data group due to a burst noise within a channel, the percentile is merely 6.67% ($=1/15\times 100$). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as shown in FIG. 9, either main service data may be assigned between each data group, or data groups corresponding to different parades may be assigned between each data group. More specifically, data groups corresponding to multiple parades may be assigned to one MH frame.

Basically, the method of assigning data groups corresponding to multiple parades is very similar to the method of assigning data groups corresponding to a single parade. In other words, data groups included in other parades that are to be assigned to an MH frame are also respectively assigned according to a cycle period of 4 slots. At this point, data groups of a different parade may be sequentially assigned to the respective slots in a circular method.

Herein, the data groups are assigned to slots starting from the ones to which data groups of the previous parade have not yet been assigned.

For example, when it is assumed that data groups corresponding to a parade are assigned as shown in FIG. 9, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 10:
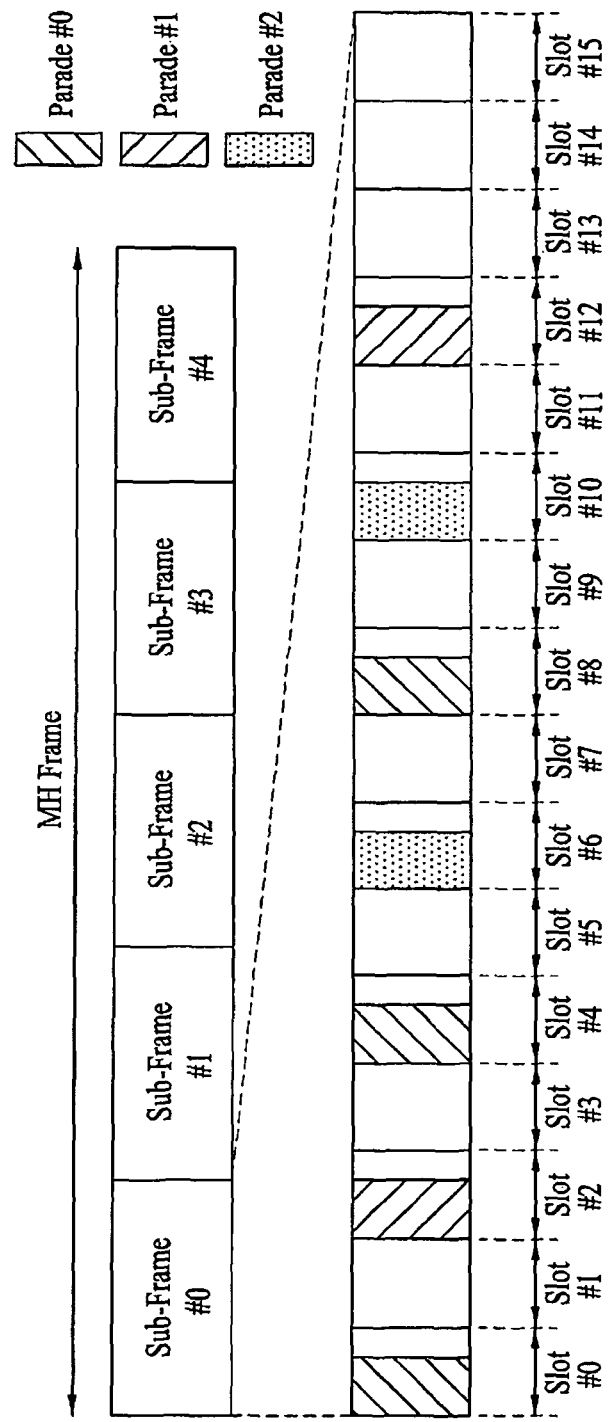
FIG. 10 illustrates an example of 3 parades being assigned to an MH frame according to the present invention.

FIG. 10 illustrates an example of transmitting 3 parades (Parade #0, Parade #1, and Parade #2) to an MH frame. More specifically, FIG. 10 illustrates an example of transmitting parades included in one of 5 sub-frames, wherein the 5 sub-frames configure one MH frame.

When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame.

Also, when the $2^{nd}$ parade includes 2 data groups for each sub-frame, the positions of each data groups within the sub-frames may be obtained by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame.

Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single MH frame, and, in each sub-frame, the data groups are serially allocated to a group space having 4 slots from left to right.

Therefore, a number of groups of one parade per sub-frame (NoG) may correspond to any one integer from '1' to '8'. Herein, since one MH frame includes 5 sub-frames, the total number of data groups within a parade that can be allocated to an MH frame may correspond to any one multiple of '5' ranging from '5' to '40'.

Figure 11:
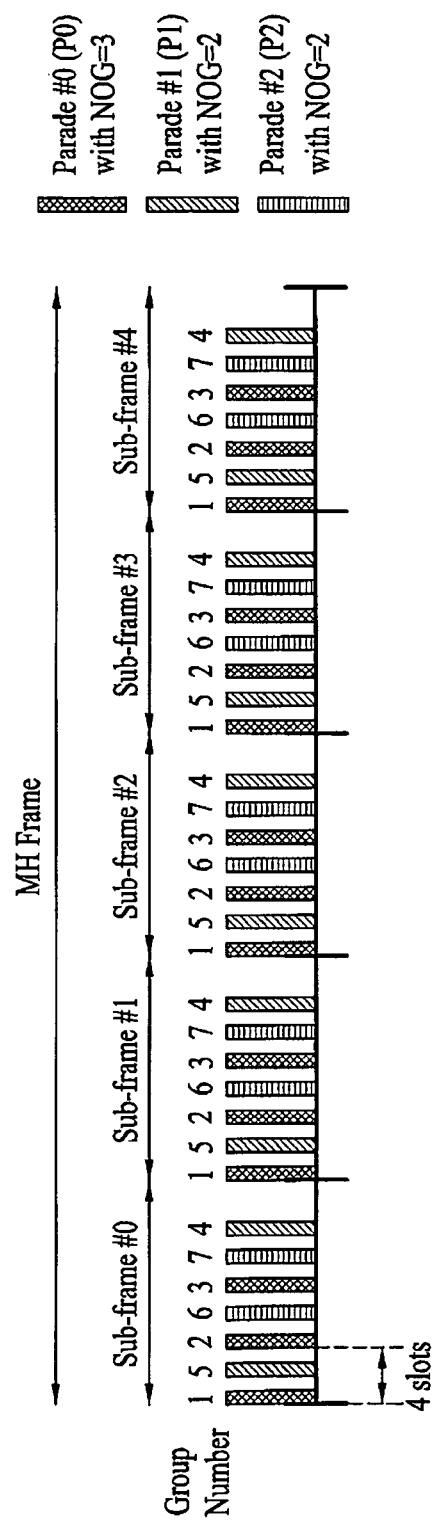
FIG. 11 illustrates an example of the process of assigning 3 parades shown in FIG. 10 being expanded to 5 sub-frames within an MH frame.

FIG. 11 illustrates an example of expanding the assignment process of 3 parades, shown in FIG. 10, to 5 sub-frames within an MH frame.

Figure 12:
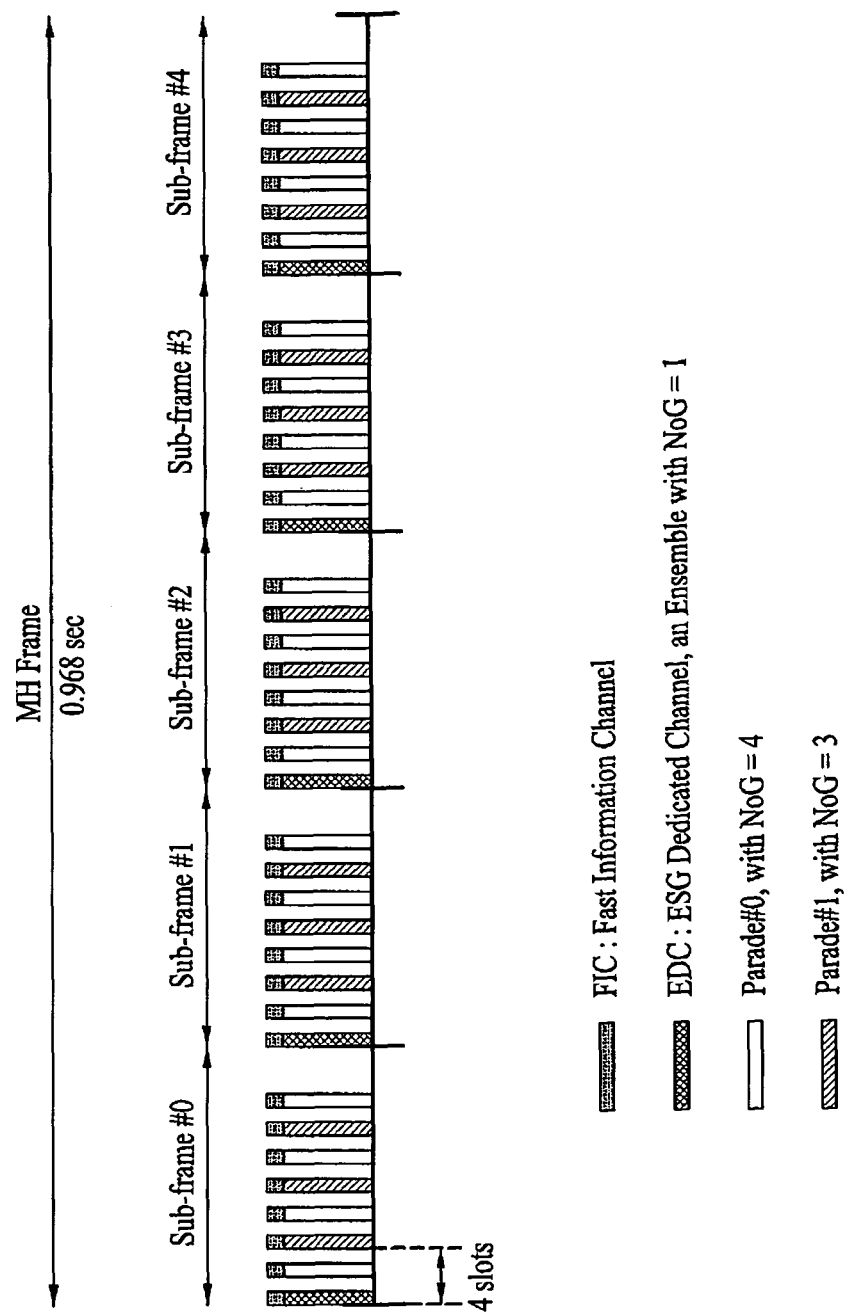
FIG. 12 illustrates a data transmission structure according to an embodiment of the present invention, wherein signaling data are included in a data group so as to be transmitted.

FIG. 12 illustrates a data transmission structure according to an embodiment of the present invention, wherein signaling data are included in a data group so as to be transmitted. As described above, an MH frame is divided into 5 sub-frames. Data groups corresponding to a plurality of parades co-exist in each sub-frame. Herein, the data groups corresponding to each parade are grouped by MH frame units, thereby configuring a single parade. The data structure shown in FIG. 12 includes 3 parades, one ESG dedicated channel (EDC) parade (i.e., parade with NoG=1), and 2 service parades (i.e., parade with NoG=4 and parade with NoG=3). Also, a predetermined portion of each data group (i.e., 37 bytes/data group) is used for delivering (or sending) FIC information associated with mobile service data, wherein the FIC information is separately encoded from the RS-encoding process. The FIC region assigned to each data group consists of one FIC segments. Herein, each segment is interleaved by MH sub-frame units, thereby configuring an FIC body, which corresponds to a completed FIC transmission structure. However, whenever required, each segment may be interleaved by MH frame units and not by MH sub-frame units, thereby being completed in MH frame units.

Meanwhile, the concept of an MH ensemble is applied in the embodiment of the present invention, thereby defining a collection (or group) of services. Each MH ensemble carries the same QoS and is coded with the same FEC code. Also, each MH ensemble has the same unique identifier (i.e., ensemble ID) and corresponds to consecutive RS frames.

As shown in FIG. 12, the FIC segment corresponding to each data group described service information of an MH ensemble to which the corresponding data group belongs. When FIC segments within a sub-frame are grouped and deinterleaved, all service information of a physical channel through which the corresponding FICs are transmitted may be obtained. Therefore, the receiving system may be able to acquire the channel information of the corresponding physical channel, after being processed with physical channel tuning, during a sub-frame period.

Furthermore, FIG. 12 illustrates a structure further including a separate EDC parade apart from the service parade and wherein electronic service guide (ESG) data are transmitted in the $1^{st}$ slot of each sub-frame.

Hierarchical Signaling Structure

Figure 13:
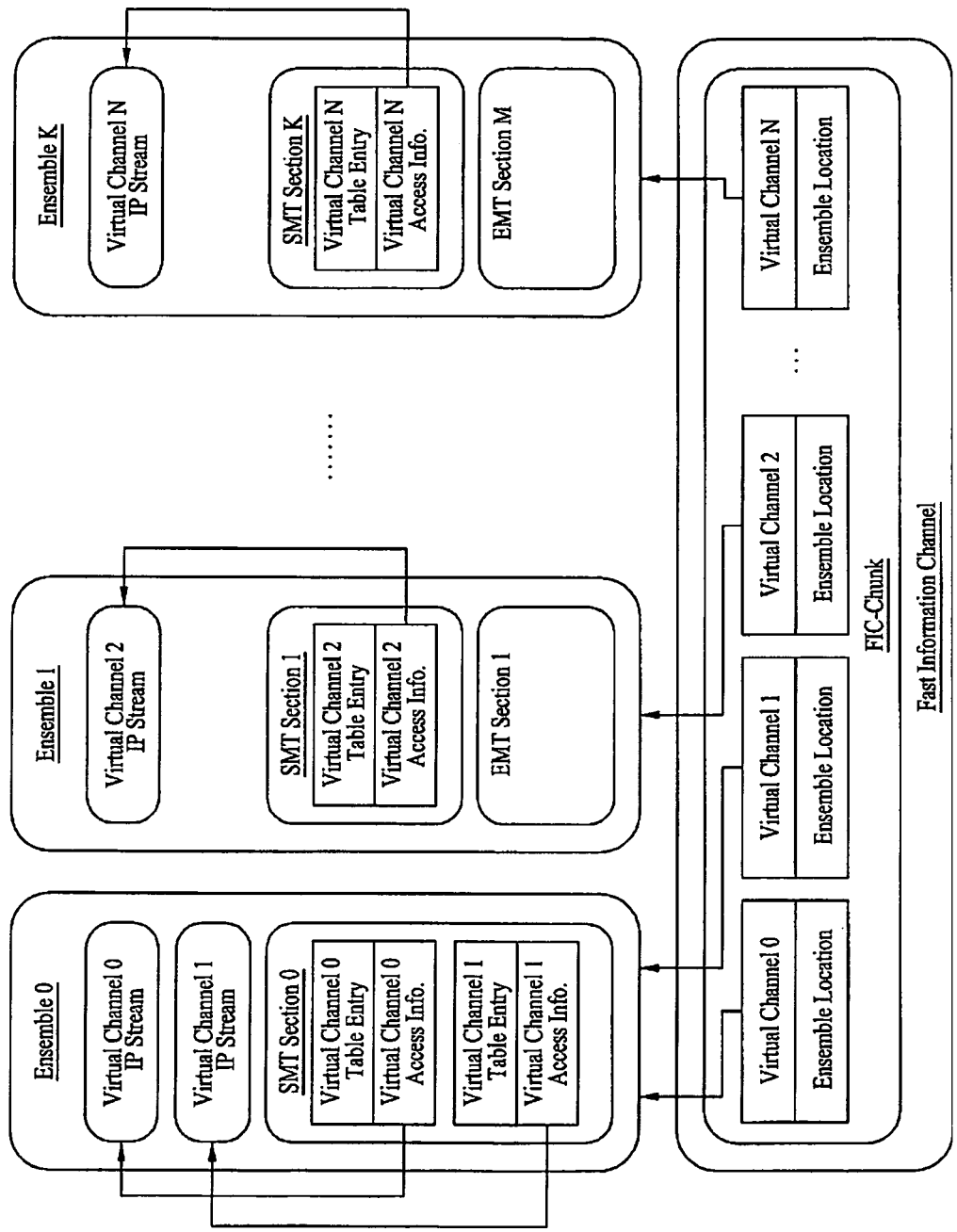
FIG. 13 illustrates a hierarchical signaling structure according to an embodiment of the present invention.

FIG. 13 illustrates a hierarchical signaling structure according to an embodiment of the present invention. As shown in FIG. 13, the mobile broadcasting technology according to the embodiment of the present invention adopts a signaling method using FIC and SMT. In the description of the present invention, the signaling structure will be referred to as a hierarchical signaling structure.

Hereinafter, a detailed description on how the receiving system accesses a virtual channel via FIC and SMT will now be given with reference to FIG. 13.

The FIC body defined in an MH transport (Ml) identifies the physical location of each the data stream for each virtual channel and provides very high level descriptions of each virtual channel.

Being MH ensemble level signaling information, the service map table (SMT) provides MH ensemble level signaling information. The SMT provides the IP access information of each virtual channel belonging to the respective MH ensemble within which the SMT is carried. The SMT also provides all IP stream component level information required for the virtual channel service acquisition.

Referring to FIG. 13, each MH ensemble (i.e., Ensemble 0, Ensemble 1, . . . , Ensemble K) includes a stream information on each associated (or corresponding) virtual channel (e.g., virtual channel 0 IP stream, virtual channel 1 IP stream, and virtual channel 2 IP stream). For example, Ensemble 0 includes virtual channel 0 IP stream and virtual channel 1 IP stream. And, each MH ensemble includes diverse information on the associated virtual channel (i.e., Virtual Channel 0 Table Entry, Virtual Channel 0 Access Info, Virtual Channel 1 Table Entry, Virtual Channel 1 Access Info, Virtual Channel 2 Table Entry, Virtual Channel 2 Access Info, Virtual Channel N Table Entry, Virtual Channel N Access Info, and so on).

The FIC body payload includes information on MH ensembles (e.g., ensemble_id field, and referred to as "ensemble location" in FIG. 13) and information on a virtual channel associated with the corresponding MH ensemble (e.g., when such information corresponds to a major_channel_num field and a minor_channel_num field, the information is expressed as Virtual Channel 0, Virtual Channel 1, . . . , Virtual Channel N in FIG. 13).

The application of the signaling structure in the receiving system will now be described in detail.

When a user selects a channel he or she wishes to view (hereinafter, the user-selected channel will be referred to as "channel θ" for simplicity), the receiving system first parses the received FIC. Then, the receiving system acquires information on an MH ensemble (i.e., ensemble location), which is associated with the virtual channel corresponding to channel θ (hereinafter, the corresponding MH ensemble will be referred to as "MH ensemble θ" for simplicity). By acquiring slots only corresponding to the MH ensemble θ using the time-slicing method, the receiving system configures ensemble θ. The ensemble θ configured as described above, includes an SMT on the associated virtual channels (including channel θ) and IP streams on the corresponding virtual channels. Therefore, the receiving system uses the SMT included in the MH ensemble θ in order to acquire various information on channel θ (e.g., Virtual Channel θ Table Entry) and stream access information on channel θ (e.g., Virtual Channel θ Access Info). The receiving system uses the stream access information on channel θ to receive only the associated IP streams, thereby providing channel θ services to the user.

Fast Information Channel (FIC)

The digital broadcast receiving system according to the present invention adopts the fast information channel (FIC) for a faster access to a service that is currently being broadcasted.

More specifically, the FIC handler 215 of FIG. 1 parses the FIC body, which corresponds to an FIC transmission structure, and outputs the parsed result to the physical adaptation control signal handler 216.

Figure 14:
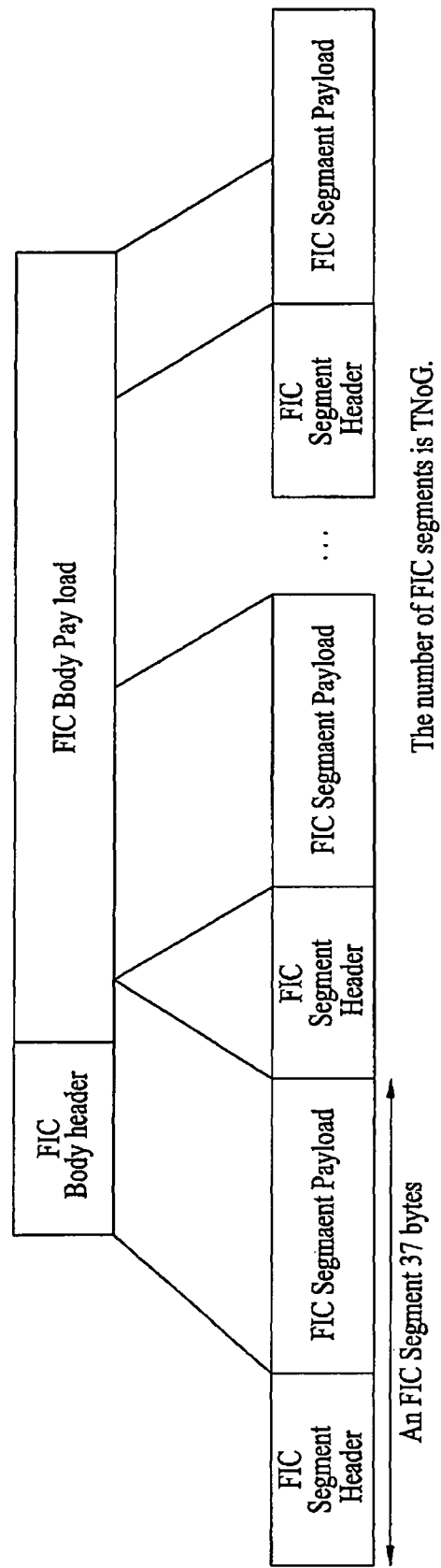
FIG. 14 illustrates an exemplary FIC body format according to an embodiment of the present invention.

FIG. 14 illustrates an exemplary FIC body format according to an embodiment of the present invention. According to the embodiment of the present invention, the FIC format consists of an FIC body header and an FIC body payload.

Meanwhile, according to the embodiment of the present invention, data are transmitted through the FIC body header and the FIC body payload in FIC segment units. Each FIC segment has the size of 37 bytes, and each FIC segment consists of a 2-byte FIC segment header and a 35-byte FIC segment payload. More specifically, an FIC body configured of an FIC body header and an FIC body payload, is segmented in units of 35 data bytes, which are then carried in at least one FIC segment within the FIC segment payload, so as to be transmitted.

In the description of the present invention, an example of inserting one FIC segment in one data group, which is then transmitted, will be given. In this case, the receiving system receives a slot corresponding to each data group by using a time-slicing method.

The signaling decoder 190 included in the receiving system shown in FIG. 1 collects each FIC segment inserted in each data group. Then, the signaling decoder 190 uses the collected FIC segments to created a single FIC body. Thereafter, the signaling decoder 190 performs a decoding process on the FIC body payload of the created FIC body, so that the decoded FIC body payload corresponds to an encoded result of a signaling encoder (not shown) included in the transmitting system. Subsequently, the decoded FIC body payload is outputted to the FIC handler 215. The FIC handler 215 parses the FIC data included in the FIC body payload, and then outputs the parsed FIC data to the physical adaptation control signal handler 216. The physical adaptation control signal handler 216 uses the inputted FIC data to perform processes associated with MH ensembles, virtual channels, SMTs, and so on.

According to an embodiment of the present invention, when an FIC body is segmented, and when the size of the last segmented portion is smaller than 35 data bytes, it is assumed that the lacking number of data bytes in the FIC segment payload is completed with by adding the same number of stuffing bytes therein, so that the size of the last FIC segment can be equal to 35 data bytes.

However, it is apparent that the above-described data byte values (i.e., 37 bytes for the FIC segment, 2 bytes for the FIC segment header, and 35 bytes for the FIC segment payload) are merely exemplary, and will, therefore, not limit the scope of the present invention.

FIG. 15 illustrates an exemplary bit stream syntax structure with respect to an FIC segment according to an embodiment of the present invention.

Herein, the FIC segment signifies a unit used for transmitting the FIC data. The FIC segment consists of an FIC segment header and an FIC segment payload. Referring to FIG. 15, the FIC segment payload corresponds to the portion starting from the 'for' loop statement. Meanwhile, the FIC segment header may include a FIC_type field, an error_indicator field, an FIC_seg_number field, and an FIC_last_seg_number field. A detailed description of each field will now be given.

The FIC_type field is a 2-bit field indicating the type of the corresponding FIC.

The error_indicator field is a 1-bit field, which indicates whether or not an error has occurred within the FIC segment during data transmission. If an error has occurred, the value of the error_indicator field is set to '1'. More specifically, when an error that has failed to be recovered still remains during the configuration process of the FIC segment, the error_indicator field value is set to '1'. The error_indicator field enables the receiving system to recognize the presence of an error within the FIC data.

The FIC_seg_number field is a 4-bit field. Herein, when a single FIC body is divided into a plurality of FIC segments and transmitted, the FIC_seg_number field indicates the number of the corresponding FIC segment. Finally, the FIC_last_seg_number field is also a 4-bit field.

The FIC_last_seg_number field indicates the number of the last FIC segment within the corresponding FIC body.

FIG. 16 illustrates an exemplary bit stream syntax structure with respect to a payload of an FIC segment according to the present invention, when an FIC type field value is equal to '0'.

According to the embodiment of the present invention, the payload of the FIC segment is divided into 3 different regions.

A first region of the FIC segment payload exists only when the FIC_seg_number field value is equal to '0'. Herein, the first region may include a current_next_indicator field, an ESG_version field, and a transport_stream_id field. However, depending upon the embodiment of the present invention, it may be assumed that each of the 3 fields exists regardless of the FIC_seg_number field.

The current_next_indicator field is a 16-bit field. The current_next_indicator field acts as an indicator identifying whether the corresponding FIC data carry MH ensemble configuration information of an MH frame including the current FIC segment, or whether the corresponding FIC data carry MH ensemble configuration information of a next MH frame.

The ESG_version field is a 5-bit field indicating ESG version information. Herein, by providing version information on the service guide providing channel of the corresponding ESG, the ESG_version field enables the receiving system to notify whether or not the corresponding ESG has been updated.

Finally, the transport_stream_id field is a 16-bit field acting as a unique identifier of a broadcast stream through which the corresponding FIC segment is being transmitted.

A second region of the FIC segment payload corresponds to an ensemble loop region, which includes an ensemble_id field, an SI_version field, and a num_channel field.

More specifically, the ensemble_id field is an 8-bit field indicating identifiers of an MH ensemble through which MH services are transmitted. The MH services will be described in more detail in a later process. Herein, the ensemble_id field binds the MH services and the MH ensemble.

The SI_version field is a 4-bit field indicating version information of SI data included in the corresponding ensemble, which is being transmitted within the RS frame.

Finally, the num_channel field is an 8-bit field indicating the number of virtual channel being transmitted via the corresponding ensemble.

A third region of the FIC segment payload a channel loop region, which includes a channel_type field, a channel_activity field, a CA_indicator field, a stand_alone_service_indicator field, a major_channel_num field, and a minor_channel_num field. The channel_type field is a 5-bit field indicating a service type of the corresponding virtual channel.

For example, the channel_type field may indicates an audio/video channel, an audio/video and data channel, an audio-only channel, a data-only channel, a file download channel, an ESG delivery channel, a notification channel, and so on.

The channel_activity field is a 2-bit field indicating activity information of the corresponding virtual channel. More specifically, the channel_activity field may indicate whether the current virtual channel is providing the current service.

The CA_indicator field is a 1-bit field indicating whether or not a conditional access (CA) is applied to the current virtual channel.

The stand_alone_service_indicator field is also a 1-bit field, which indicates whether the service of the corresponding virtual channel corresponds to a stand alone service.

The major_channel_num field is an 8-bit field indicating a major channel number of the corresponding virtual channel.

Finally, the minor_channel_num field is also an 8-bit field indicating a minor channel number of the corresponding virtual channel.

Service Table Map

FIG. 17 illustrates an exemplary bit stream syntax structure of a service map table (hereinafter referred to as "SMT") according to the present invention.

According to the embodiment of the present invention, the SMT is configured in an MPEG-2 private section format. However, this will not limit the scope and spirit of the present invention. The SMT according to the embodiment of the present invention includes description information for each virtual channel within a single MH ensemble. And, additional information may further be included in each descriptor area.

Herein, the SMT according to the embodiment of the present invention includes at least one field and is transmitted from the transmitting system to the receiving system.

As described in FIG. 3, the SMT section may be transmitted by being included in the MH TP within the RS frame. In this case, each of the RS frame decoders 170 and 180, shown in FIG. 1, decodes the inputted RS frame, respectively. Then, each of the decoded RS frames is outputted to the respective RS frame handler 211 and 212. Thereafter, each RS frame handler 211 and 212 identifies the inputted RS frame by row units, so as to create an MH TP, thereby outputting the created MH TP to the MH TP handler 213.

When it is determined that the corresponding MH TP includes an SMT section based upon the header in each of the inputted MH TP, the MH TP handler 213 parses the corresponding SMT section, so as to output the SI data within the parsed SMT section to the physical adaptation control signal handler 216. However, this is limited to when the SMT is not encapsulated to IP datagrams.

Meanwhile, when the SMT is not encapsulated to IP datagrams, and when it is determined that the corresponding MH TP includes an SMT section based upon the header in each of the inputted MH TP, the MH TP handler 213 outputs the SMT section to the IP network stack 220. Accordingly, the IP network stack 220 performs IP and UDP processes on the inputted SMT section and, then, outputs the processed SMT section to the SI handler 240. The SI handler 240 parses the inputted SMT section and controls the system so that the parsed SI data can be stored in the storage unit 290.

The following corresponds to example of the fields that may be transmitted through the SMT.

The table_id field corresponds to an 8-bit unsigned integer number, which indicates the type of table section.

The table_id field allows the corresponding table to be defined as the service map table (SMT).

The ensemble_id field is an 8-bit unsigned integer field, which corresponds to an ID value associated to the corresponding MH ensemble. Herein, the ensemble_id field may be assigned with a value ranging from range '0x00' to '0x3F'. It is preferable that the value of the ensemble_id field is derived from the parade_id of the TPC data, which is carried from the baseband processor of MH physical layer subsystem. When the corresponding MH ensemble is transmitted through (or carried over) the primary RS frame, a value of '0' may be used for the most significant bit (MSB), and the remaining 7 bits are used as the parade_id value of the associated MH parade (i.e., for the least significant 7 bits). Alternatively, when the corresponding MH ensemble is transmitted through (or carried over) the secondary RS frame, a value of '1' may be used for the most significant bit (MSB).

The num_channels field is an 8-bit field, which specifies the number of virtual channels in the corresponding SMT section.

Meanwhile, the SMT according to the embodiment of the present invention provides information on a plurality of virtual channels using the 'for' loop statement.

The major_channel_num field corresponds to an 8-bit field, which represents the major channel number associated with the corresponding virtual channel. Herein, the major_channel_num field may be assigned with a value ranging from '0x00' to '0xFF'.

The minor_channel_num field corresponds to an 8-bit field, which represents the minor channel number associated with the corresponding virtual channel. Herein, the minor_channel_num field may be assigned with a value ranging from '0x00' to '0xFF'.

The short_channel_name field indicates the short name of the virtual channel.

The service_id field is a 16-bit unsigned integer number (or value), which identifies the virtual channel service.

The service_type field is a 6-bit enumerated type field, which designates the type of service carried in the corresponding virtual channel as defined in Table 2 below.

TABLE 2

| | |
|---|---|
| 0x00 | [Reserved] |
| 0x01 | MH_digital_television field: the virtual channel carries television programming (audio, video and optional associated data) conforming to ATSC standards. |
| 0x02 | MH_audio field: the virtual channel carries audio programming (audio service and optional associated data) conforming to ATSC standards. |
| 0x03 | MH_data_only_service field: the virtual channel carries a data service conforming to ATSC standards, but no video or audio component. |
| 0x04 to 0xFF | [Reserved for future ATSC usage] |

The virtual_channel_activity field is a 2-bit enumerated field identifying the activity status of the corresponding virtual channel. When the most significant bit (MSB) of the virtual_channel_activity field is '1', the virtual channel is active, and when the most significant bit (MSB) of the virtual_channel_activity field is '0', the virtual channel is inactive. Also, when the least significant bit (LSB) of the virtual_channel_activity field is '1', the virtual channel is hidden (when set to 1), and when the least significant bit (LSB) of the virtual_channel_activity field is '0', the virtual channel is not hidden.

The num_components field is a 5-bit field, which specifies the number of IP stream components in the corresponding virtual channel.

The IP_version_flag field corresponds to a 1-bit indicator. More specifically, when the value of the IP_version_flag field is set to '1', this indicates that a source_IP_address field, a virtual_channel_target_IP_address field, and a component_target_IP_address field are IPv6 addresses. Alternatively, when the value of the IP_version_flag field is set to '0', this indicates that the source_IP_address field, the virtual_channel_target_IP_address field, and the component_target_IP_address field are IPv4.

The source_IP_address_flag field is a 1-bit Boolean flag, which indicates, when set, that a source IP address of the corresponding virtual channel exist for a specific multicast source.

The virtual_channel_target_IP_address_flag field is a 1-bit Boolean flag, which indicates, when set, that the corresponding IP stream component is delivered through IP datagrams with target IP addresses different from the virtual_channel_target_IP-address. Therefore, when the flag is set, the receiving system (or receiver) uses the component_target_IP_address as the target_IP_address in order to access the corresponding IP stream component. Accordingly, the receiving system (or receiver) may ignore the virtual_channel_target_IP_address field included in the num_channels loop.

The source_IP_address field corresponds to a 32-bit or 128-bit field. Herein, the source_IP_address field will be significant (or present), when the value of the source_IP_address_flag field is set to '1'. However, when the value of the source_IP_address_flag field is set to '0', the source_IP_address field will become insignificant (or absent). More specifically, when the source_IP_address_flag field value is set to '1', and when the IP_version_flag field value is set to '0', the source_IP_address field indicates a 32-bit IPv4 address, which shows the source of the corresponding virtual channel. Alternatively, when the IP_version_flag field value is set to '1', the source_IP_address field indicates a 128-bit IPv6 address, which shows the source of the corresponding virtual channel.

The virtual_channel_target_IP_address field also corresponds to a 32-bit or 128-bit field. Herein, the virtual_channel_target_IP_address field will be significant (or present), when the value of the virtual_channel_target_IP_address_flag field is set to '1'. However, when the value of the virtual_channel_target_IP_address_flag field is set to '0', the virtual_channel_target_IP_address field will become insignificant (or absent). More specifically, when the virtual_channel_target_IP_address_flag field value is set to '1', and when the IP_version_flag field value is set to '0', the virtual_channel_target_IP address field indicates a 32-bit target IPv4 address associated to the corresponding virtual channel. Alternatively, when the virtual_channel_target_IP_address_flag field value is set to '1', and when the IP_version_flag field value is set to '1', the virtual_channel_target_IP_address field indicates a 64-bit target IPv6 address associated to the corresponding virtual channel. If the virtual_channel_target_IP_address field is insignificant (or absent), the component_target_IP_address field within the num_channels loop should become significant (or present). And, in order to enable the receiving system to access the IP stream component, the component_target_IP_address field should be used.

The EMT_activity_flag field indicates whether program table information including additional information associated with the corresponding ensemble exists. The program table information may describe information on an additional service that is not described in a service of the corresponding ensemble in the SMT. Herein, the program table information will be referred to as an extended service map table (EMT). And, the EMT will now be described in more detail. The receiving system (or receiver) uses the EMT_activity_flag field to determine whether an extended service map table (EMT), which describes additional service information associated with the corresponding SMT, is additionally transmitted in the broadcast signal. For example, when the EMT_activity_flag field value is equal to '1', the EMT is transmitted to the corresponding ensemble. On the other hand, when the EMT_activity_flag field value is equal to '0', the EMT is not transmitted to the corresponding ensemble.

Meanwhile, the SMT according to the embodiment of the present invention uses a 'for' loop statement in order to provide information on a plurality of components.

Herein, the RTP_payload_type field, which is assigned with 7 bits, identifies the encoding format of the component based upon Table 3 shown below. When the IP stream component is not encapsulated to RTP, the RTP_payload_type field shall be ignored (or deprecated). Table 3 below shows an example of an RTP payload type.

TABLE 3

| RTP_payload_type | Meaning |
|---|---|
| 35 | AVC video |
| 36 | MH audio |
| 37 to 72 | [Reserved for future ATSC use] |

The component_target_IP_address_flag field is a 1-bit Boolean flag, which indicates, when set, that the corresponding IP stream component is delivered through IP datagrams with target IP addresses different from the virtual_channel_target_IP_address. Furthermore, when the component_target_IP_address_flag is set, the receiving system (or receiver) uses the component_target_IP_address field as the target IP address for accessing the corresponding IP stream component. Accordingly, the receiving system (or receiver)

will ignore the virtual_channel_target_IP_address field included in the num_channels loop.

The component_target_IP_address field corresponds to a 32-bit or 128-bit field. Herein, when the value of the IP_version_flag field is set to '0', the component_target_IP_address field indicates a 32-bit target IPv4 address associated to the corresponding IP stream component. And, when the value of the IP_version_flag field is set to '1', the component_target_IP_address field indicates a 128-bit target IPv6 address associated to the corresponding IP stream component.

The port_num_count field is a 6-bit field, which indicates the number of UDP ports associated with the corresponding IP stream component. A target UDP port number value starts from the target_UDP_port_num field value and increases (or is incremented) by 1. For the RTP stream, the target UDP port number should start from the target_UDP_port_num field value and shall increase (or be incremented) by 2. This is to incorporate RTCP streams associated with the RTP streams.

The target_UDP_port_num field is a 16-bit unsigned integer field, which represents the target UDP port number for the corresponding IP stream component. When used for RTP streams, the value of the target_UDP_port_num field shall correspond to an even number. And, the next higher value shall represent the target UDP port number of the associated RTCP stream.

The component_level_descriptor( ) represents zero or more descriptors providing additional information on the corresponding IP stream component.

The virtual_channel_level_descriptor( ) represents zero or more descriptors providing additional information for the corresponding virtual channel.

The ensemble_level_descriptor( ) represents zero or more descriptors providing additional information for the MH ensemble, which is described by the corresponding SMT.

FIG. 18 illustrates an exemplary bit stream syntax structure of an MH audio descriptor according to the present invention.

When at least one audio service is present as a component of the current event, the MH_audio_descriptor( ) shall be used as a component_level_descriptor of the SMT. The MH_audio_descriptor( ) may be capable of informing the system of the audio language type and stereo mode status. If there is no audio service associated with the current event, then it is preferable that the MH_audio_descriptor( ) is considered to be insignificant (or absent) for the current event.

Each field shown in the bit stream syntax of FIG. 18 will now be described in detail.

The descriptor_tag field is an 8-bit unsigned integer having a TBD value, which indicates that the corresponding descriptor is the MH_audio_descriptor( ).

The descriptor_length field is also an 8-bit unsigned integer, which indicates the length (in bytes) of the portion immediately following the descriptor_length field up to the end of the MH_audio_descriptor( ).

The channel_configuration field corresponds to an 8-bit field indicating the number and configuration of audio channels. The values ranging from '1' to '6' respectively indicate the number and configuration of audio channels as given for "Default bit stream index number" in Table 42 of ISO/IEC 13818-7:2006. All other values indicate that the number and configuration of audio channels are undefined.

The sample_rate_code field is a 3-bit field, which indicates the sample rate of the encoded audio data. Herein, the indication may correspond to one specific sample rate, or may correspond to a set of values that include the sample rate of the encoded audio data as defined in Table A3.3 of ATSC A/52B.

The bit_rate_code field corresponds to a 6-bit field. Herein, among the 6 bits, the lower 5 bits indicate a nominal bit rate. More specifically, when the most significant bit (MSB) is '0', the corresponding bit rate is exact. On the other hand, when the most significant bit (MSB) is '0', the bit rate corresponds to an upper limit as defined in Table A3.4 of ATSC A/53B.

The ISO_639_language_code field is a 24-bit (i.e., 3-byte) field indicating the language used for the audio stream component, in conformance with ISO 639.2/B [x]. When a specific language is not present in the corresponding audio stream component, the value of each byte will be set to '0x00'.

FIG. 19 illustrates an exemplary bit stream syntax structure of an MH RTP payload type descriptor according to the present invention.

The MH_RTP_payload_type_descriptor( ) specifies the RTP payload type. Yet, the MH_RTP_payload_type_descriptor( ) exists only when the dynamic value of the RTP_payload_type field within the num_components loop of the SMT is in the range of '96' to '127'. The MH_RTP_payload_type_descriptor( ) is used as a component_level_descriptor of the SMT.

The MH_RTP_payload_type_descriptor translates (or matches) a dynamic RTP_payload_type field value into (or with) a MIME type. Accordingly, the receiving system (or receiver) may collect (or gather) the encoding format of the IP stream component, which is encapsulated in RTP.

The fields included in the MH_RTP_payload_type_descriptor( ) will now be described in detail.

The descriptor_tag field corresponds to an 8-bit unsigned integer having the value TBD, which identifies the current descriptor as the MH_RTP_payload_type_descriptor( ).

The descriptor_length field also corresponds to an 8-bit unsigned integer, which indicates the length (in bytes) of the portion immediately following the descriptor_length field up to the end of the MH_RTP_payload_type_descriptor( ).

The RTP_payload_type field corresponds to a 7-bit field, which identifies the encoding format of the IP stream component. Herein, the dynamic value of the RTP_payload_type field is in the range of '96' to '127'.

The MIME_type_length field specifies the length (in bytes) of the MIME_type field.

The MIME_type field indicates the MIME type corresponding to the encoding format of the IP stream component, which is described by the MH_RTP_payload_type_descriptor( ).

FIG. 20 illustrates an exemplary bit stream syntax structure of an MH current event descriptor according to the present invention.

The MH_current_event_descriptor( ) shall be used as the virtual_channel_level_descriptor( ) within the SMT. Herein, the MH_current_event_descriptor( ) provides basic information on the current event (e.g., the start time, duration, and title of the current event, etc.), which is transmitted via the respective virtual channel.

The fields included in the MH_current_event_descriptor( ) will now be described in detail.

The descriptor_tag field corresponds to an 8-bit unsigned integer having the value TBD, which identifies the current descriptor as the MH_current_event_descriptor( ).

The descriptor_length field also corresponds to an 8-bit unsigned integer, which indicates the length (in bytes) of the portion immediately following the descriptor_length field up to the end of the MH_current_event_descriptor( ).

The current_event_start_time field corresponds to a 32-bit unsigned integer quantity. The current_event_start_time field represents the start time of the current event and, more specifically, as the number of GPS seconds since 00:00:00 UTC, Jan. 6, 1980.

The current_event_duration field corresponds to a 24-bit field. Herein, the current_event_duration field indicates the duration of the current event in hours, minutes, and seconds (wherein the format is in 6 digits, 4-bit BCD=24 bits).

The title_length field specifies the length (in bytes) of the title_text field. Herein, the value '0' indicates that there are no titles existing for the corresponding event.

The title_text field indicates the title of the corresponding event in event title in the format of a multiple string structure as defined in ATSC A/65C [x].

FIG. 21 illustrates an exemplary bit stream syntax structure of an MH next event descriptor according to the present invention.

The optional MH_next_event_descriptor( ) shall be used as the virtual_channel_level_descriptor( ) within the SMT. Herein, the MH_next_event_descriptor( ) provides basic information on the next event (e.g., the start time, duration, and title of the next event, etc.), which is transmitted via the respective virtual channel. The fields included in the MH_next_event_descriptor( ) will now be described in detail.

The descriptor_tag field corresponds to an 8-bit unsigned integer having the value TBD, which identifies the current descriptor as the MH_next_event_descriptor( ).

The descriptor_length field also corresponds to an 8-bit unsigned integer, which indicates the length (in bytes) of the portion immediately following the descriptor_length field up to the end of the MH_next_event_descriptor( ).

The next_event_start_time field corresponds to a 32-bit unsigned integer quantity. The next_event_start_time field represents the start time of the next event and, more specifically, as the number of GPS seconds since 00:00:00 UTC, Jan. 6, 1980.

The next_event_duration field corresponds to a 24-bit field. Herein, the next_event_duration field indicates the duration of the next event in hours, minutes, and seconds (wherein the format is in 6 digits, 4-bit BCD=24 bits).

The title_length field specifies the length (in bytes) of the title_text field. Herein, the value '0' indicates that there are no titles existing for the corresponding event.

The title_text field indicates the title of the corresponding event in event title in the format of a multiple string structure as defined in ATSC A/65C [x].

FIG. 22 illustrates an exemplary bit stream syntax structure of an MH system time descriptor according to the present invention.

The MH_system_time_descriptor( ) shall be used as the ensemble_level_descriptor( ) within the SMT. Herein, the MH_system_time_descriptor( ) provides information on current time and date. The MH_system_time_descriptor( ) also provides information on the time zone in which the transmitting system (or transmitter) transmitting the corresponding broadcast stream is located, while taking into consideration the mobile/portable characterstics of the MH service data.

The fields included in the MH_system_time_descriptor( ) will now be described in detail.

The descriptor_tag field corresponds to an 8-bit unsigned integer having the value TBD, which identifies the current descriptor as the MH_system_time_descriptor( ).

The descriptor_length field also corresponds to an 8-bit unsigned integer, which indicates the length (in bytes) of the portion immediately following the descriptor_length field up to the end of the MH_system_time_descriptor( ).

The system_time field corresponds to a 32-bit unsigned integer quantity. The system_time field represents the current system time and, more specifically, as the number of GPS seconds since 00:00:00 UTC, Jan. 6, 1980.

The GPS_UTC_offset field corresponds to an 8-bit unsigned integer, which defines the current offset in whole seconds between GPS and UTC time standards. In order to convert GPS time to UTC time, the GPS_UTC_offset is subtracted from GPS time. Whenever the International Bureau of Weights and Measures decides that the current offset is too far in error, an additional leap second may be added (or subtracted). Accordingly, the GPS_UTC_offset field value will reflect the change.

The time_zone_offset_polarity field is a 1-bit field, which indicates whether the time of the time zone, in which the broadcast station is located, exceeds (or leads or is faster) or falls behind (or lags or is slower) than the UTC time. When the value of the time_zone_offset_polarity field is equal to '0', this indicates that the time on the current time zone exceeds the UTC time. Therefore, the time_zone_offset_polarity field value is added to the UTC time value. Conversely, when the value of the time_zone_offset_polarity field is equal to '1', this indicates that the time on the current time zone falls behind the UTC time. Therefore, the time_zone_offset_polarity field value is subtracted from the UTC time value.

The time_zone_offset field is a 31-bit unsigned integer quantity. More specifically, the time_zone offset field represents, in GPS seconds, the time offset of the time zone in which the broadcast station is located, when compared to the UTC time.

The daylight_savings field corresponds to a 16-bit field providing information on the Summer Time (i.e., the Daylight Savings Time).

The time_zone field corresponds to a (5×8)-bit field indicating the time zone, in which the transmitting system (or transmitter) transmitting the corresponding broadcast stream is located.

Figure 23:
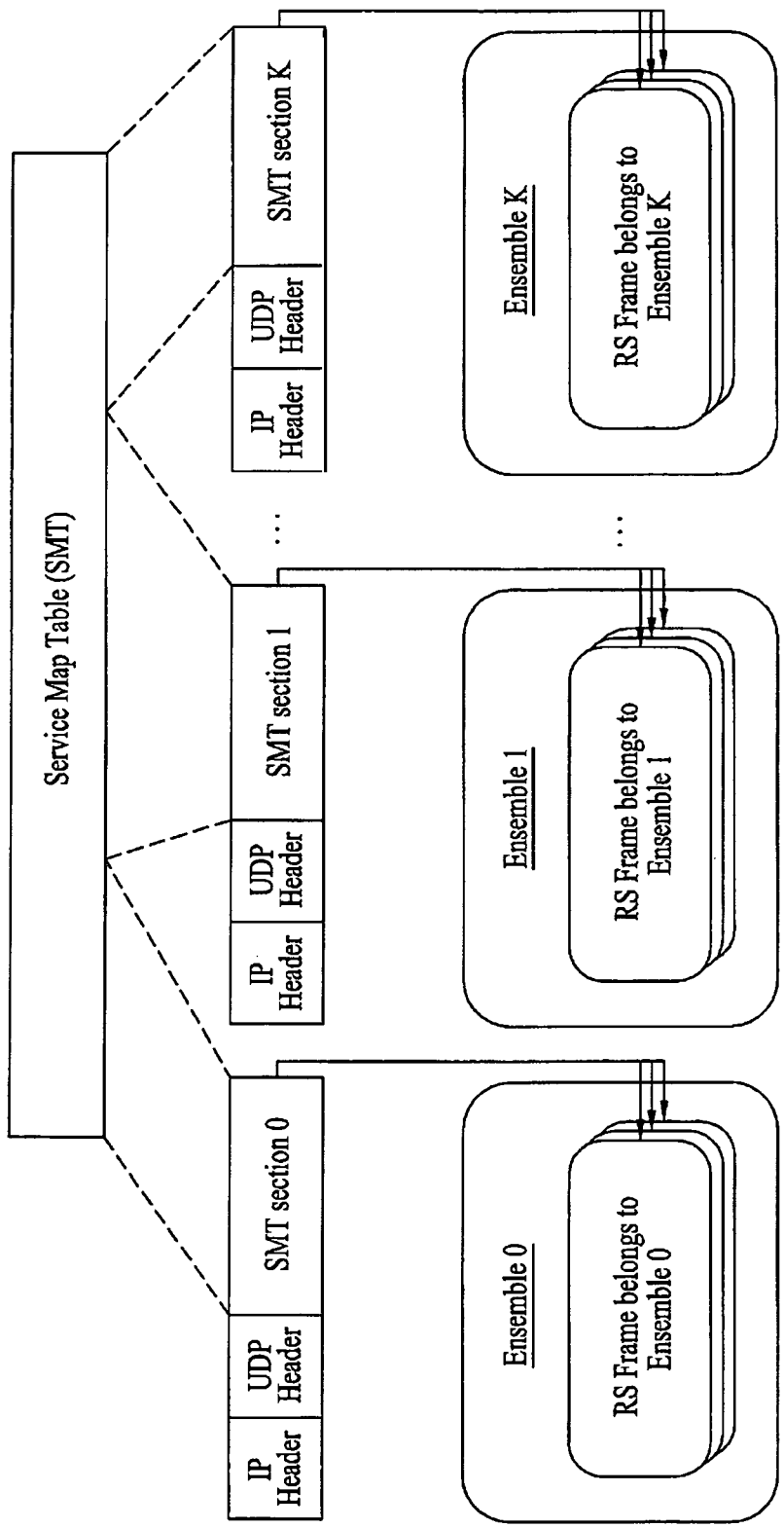
FIG. 23 illustrates segmentation and encapsulation processes of a service map table according to the present invention.

FIG. 23 illustrates segmentation and encapsulation processes of a service map table (SMT) according to the present invention.

According to the present invention, the SMT is encapsulated to UDP, while including a target IP address and a target UDP port number within the IP datagram. More specifically, the SMT is first segmented into a predetermined number of sections, then encapsulated to a UDP header, and finally encapsulated to an IP header.

In addition, the SMT section provides signaling information on all virtual channel included in the MH ensemble including the corresponding SMT section. At least one SMT section describing the MH ensemble is included in each RS frame included in the corresponding MH ensemble. Finally, each SMT section is identified by an ensemble_id included in each section. According to the embodiment of the present invention, by informing the receiving system of the target IP address and target UDP port number, the corresponding data (i.e., target IP address and target UDP port number) may be parsed without having the receiving system to request for other additional information.

For example, when the EMT_activity_flag field value in the SMT is equal to '1' (i.e., when information that EMT is to be transmitted is set up), the EMT linked to the SMT may be transmitted to the ensemble, in which the SMT is transmitted. Just as the SMT, the EMT may be transmitted to each ensemble by sections, which is the transmission unit of the EMT. Herein, the EMT may include a descriptor that describes the additional services transmitted by each ensemble. In the example shown in FIG. 24, information are set to indicate that the EMT is being transmitted to the SMT of both Ensemble 1 and Ensemble K. Furthermore, it is also indicated that EMT 1, which is linked to SMT Section 1, and EMT K, which is linked to SMT Section K, are also transmitted to Ensemble 1 and Ensemble K, respectively. Contents of the EMT will hereinafter be described in detail.

Figure 24:
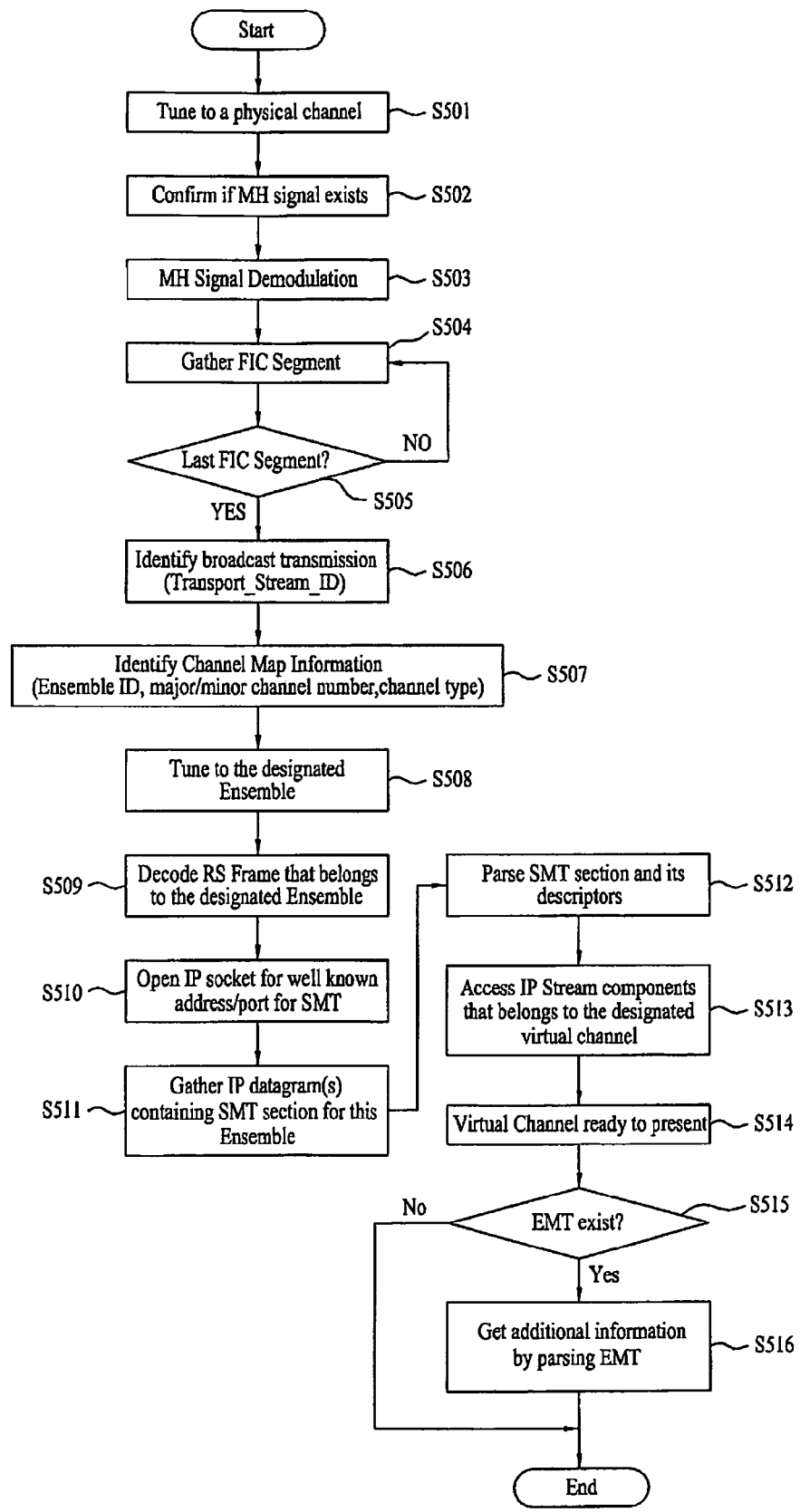
FIG. 24 illustrates a flow chart for accessing a virtual channel using FIC and SMT according to the present invention.

FIG. 24 illustrates a flow chart for accessing a virtual channel using FIC and SMT according to the present invention.

More specifically, a physical channel is tuned (S501). And, when it is determined that an MH signal exists in the tuned physical channel (S502), the corresponding MH signal is demodulated (S503). Additionally, FIC segments are grouped from the demodulated MH signal in sub-frame units (S504 and S505).

According to the embodiment of the present invention, an FIC segment is inserted in a data group, so as to be transmitted. More specifically, the FIC segment corresponding to each data group describes service information on the MH ensemble to which the corresponding data group belongs. When the FIC segments are grouped in sub-frame units and, then, deinterleaved, all service information on the physical channel through which the corresponding FIC segment is transmitted may be acquired. Therefore, after the tuning process, the receiving system may acquire channel information on the corresponding physical channel during a sub-frame period. Once the FIC segments are grouped, in S504 and S505, a broadcast stream through which the corresponding FIC segment is being transmitted is identified (S506). For example, the broadcast stream may be identified by parsing the transport_stream_id field of the FIC body, which is configured by grouping the FIC segments.

Furthermore, an ensemble identifier, a major channel number, a minor channel number, channel type information, and so on, are extracted from the FIC body (S507). And, by using the extracted ensemble information, only the slots corresponding to the designated ensemble are acquired by using the time-slicing method, so as to configure an ensemble (S508).

Subsequently, the RS frame corresponding to the designated ensemble is decoded (S509), and an IP socket is opened for SMT reception (S510). According to the example given in the embodiment of the present invention, the SMT is encapsulated to UDP, while including a target IP address and a target UDP port number within the IP datagram. More specifically, the SMT is first segmented into a predetermined number of sections, then encapsulated to a UDP header, and finally encapsulated to an IP header. According to the embodiment of the present invention, by informing the receiving system of the target IP address and target UDP port number, the receiving system parses the SMT sections and the descriptors of each SMT section without requesting for other additional information (S511).

The SMT section provides signaling information on all virtual channel included in the MH ensemble including the corresponding SMT section. At least one SMT section describing the MH ensemble is included in each RS frame included in the corresponding MH ensemble. Also, each SMT section is identified by an ensemble_id included in each section. The SMT may include information indicating whether or not EMT, which transmits information on additional services, is transmitted to the corresponding ensemble. Furthermore each SMT provides IP access information on each virtual channel subordinate to the corresponding MH ensemble including each SMT. Finally, the SMT provides IP stream component level information required for the servicing of the corresponding virtual channel.

Therefore, by using the information parsed from the SMT, the IP stream component belonging to the virtual channel requested for reception may be accessed (S513). Accordingly, the service associated with the corresponding virtual channel is provided to the user (S514).

If it is determined in Step 512 that the SMT includes information indicating that an EMT exists in the corresponding ensemble (S515: 'YES'), the EMT may be parsed in the corresponding ensemble so as to acquire the additional information (S516). Thereafter, by using the information acquired in Step 516, the additional services, which cannot be described by the SMT, may be described, and the corresponding additional services may then be provided.

FIG. 25 illustrates an exemplary bit stream syntax structure of an EMT according to another embodiment of the present invention. The above-described SMT may describe a stream included in the service-providing virtual channel and channel information on the corresponding virtual channel. And, when the EMT_activity_flag field of the SMT is set up, an EMT, which is added to the SMT so as to describe the services that are to be provided, is transmitted.

Accordingly, the SMT may enable audio/video/data streams of the broadcast signal to be swiftly or quickly outputted from the digital broadcast receiving system. And, the EMT may either provide more detailed information on each virtual channel or describe the additional services.

Contents of the EMT will now be described in detail.

The table_id field is an 8-bit table identifier, which may be set up as an identifier for identifying the EMT. The section_syntax_indicator field corresponds to an indicator defining the section format of the EMT. For example, the section format may correspond to MPEG long-form syntax.

The Private_indicator field indicates whether or not the EMT follows (or is in accordance with) a private section. The reserved field corresponds to a non-designated field, and the value of the reserved field may, for example, be set to '1'.

The section_length field indicates the section length of the corresponding EMT. The transport_stream_id field represents a transport_stream indicator of a physical channel through which the corresponding EMT is being transmitted. Herein, also, the reserved field corresponds to a non-designated field, and the value of the reserved field may, for example, be set to '1'.

The version_number field indicates the version number of the corresponding EMT. The current_next_indicator field indicates whether the data included in subsequent EMT sections are currently applicable. The section_number field indicates the section number of the corresponding EMT.

The last_section_number field indicates the last section number of the corresponding EMT. The EMT_protocol_version field indicates the protocol version of the corresponding EMT section.

The ensemble_id field indicates an identification number of the ensemble which the EMT describes. The num_channels field indicates the number of channels included in the corresponding ensemble.

The major_channel_number field indicates the major channel number of the corresponding virtual channel, and the minor_channel_number field indicates the minor channel number of the corresponding virtual channel.

The num_components field indicates the number of components included in the corresponding virtual channel.

The EMT may include a descriptor with respect to each level. For example, the EMT may include adescriptor for a component level (i.e., component_level_descriptor), a descriptor for an event level (i.e., event_level_descriptor), a descriptor for a virtual channel level (i.e., virtual_channel_level_descriptor), and a descriptor for an ensemble level (i.e., ensemble_level_descriptor).

More specifically, the component_level_descriptor may include information on the corresponding component.

The num_events field indicates a number of events included in an event.

And, the event_level_descriptor may include information on the corresponding event. Furthermore, the virtual_channel_level_descriptor and ensemble descriptor for each virtual channel may respectively include information on the corresponding virtual channel and the corresponding ensemble (i.e., ensemble_level_descriptor).

For example, the SMT describes basic information on a virtual channel of an ensemble, whereas the EMT may deliver (or transmit) additional service information or detailed information on additional service with respect to the virtual channel included in the corresponding ensemble via descriptors for each level. The descriptor for the EMT may include program guide information for the virtual channel, information associated with data broadcasting, information associated with interactive services, permission information associated with whether or not access to each virtual channel has been permitted, and so on.

Furthermore, a descriptor for an audio component among the virtual channel components shown in FIG. 18, a descriptor for which the virtual channel describes a current/next event, as shown in FIG. 19 and FIG. 20, and a descriptor describing a system time, as shown in FIG. 22, may be included in the EMT so as to be transmitted and received.

Also, the above-described EMT (or SMT according to the second embodiment of the present invention) may be divided into constant units, such as section units. Herein, each of the section units may describe an ensemble.

When an SMT is received, the SI handler 240 of the receiving system shown in FIG. 1 may parse the SMT. Herein, when the SI handler 240 acquires information indicating that an EMT included in the SMT is being received, the SI handler 240 may receive the EMT from the IP network stack 220. The SI handler 240 may include an EMT parser, which parses detailed information on the virtual channel included in the EMT and, then, stores the parsed information in the storage unit 290. The MH management processor 200 reads the information parsed from the EMT from the storage unit 290. Then, the MH management processor 200 delivers (or sends) the read information to the MH baseband processor 100 or the MH presentation processor 300.

For example, when the information parsed from the EMT corresponds to information associated with a current or next event, or when the information parsed from the EMT corresponds to information associated with data broadcasting, the MH presentation processor 300 may control the system so that the information associated with an event or information associated with data broadcasting, which is delivered to the EMT, can be displayed to the user.

Furthermore, when the additional information parsed from the EMT corresponds to permission information on the storage or copying of specific broadcast data content, the MH management processor 200 may store or copy the broadcast data content received from a broadcast signal based upon the corresponding permission information.

For example, when the application manager activates an application for additional service, such as data broadcasting, and when the additional service information transmitted to the EMT is read from the storage unit 290, the corresponding additional service information may be used to provide the additional service to the user.

Therefore, by using the information delivered to the above-described EMT (or SMT according to the second embodiment of the present invention), the receiving system (or receiver) may provide additional service information, which is associated with the corresponding ensemble, virtual channel, and component of the virtual channel, to the user along with the broadcast signal.

As described above, the present invention may provide a service transmitted through a virtual channel by using the SMT. The present invention may also identify that the EMT is being transmitted from the SMT. Furthermore, the present invention may acquire detailed additional information associated with the component included in the virtual channel, the event, the virtual channel, and the ensemble from the EMT.

Thereafter, the present invention may provide the detailed additional information acquired from the EMT as an additional service.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of processing broadcast data in a broadcast receiver, the method comprising:

receiving a broadcast signal, the broadcast signal comprising mobile service data, a signaling information table including access information of the mobile service data, a plurality of fast information channel (FIC) segments, and transmission parameter channel (TPC) data, wherein the plurality of FIC segments are comprised of FIC data, each FIC segment comprising a 2-byte segment header and a 35-byte segment payload including a portion of the FIC data, wherein the signaling information table further includes number information specifying a number of mobile services signaled by the signaling information table, service identification information identifying a mobile service and a component descriptor for a component of the mobile service in the signaling information table, the component descriptor including sampling rate information identifying a sampling rate of an audio stream component, wherein the signaling information table further includes component number information specifying a number of Internet Protocol (IP) stream components in the identified mobile service, component IP address flag information indicating whether component IP address information is present for an IP stream component, and the component IP address information specifying a source address of an IP datagram carrying the IP stream component;

demodulating the received broadcast signal; and collecting the FIC segments included in the demodulated broadcast signal and recovering the FIC data, wherein the FIC data includes information for rapid mobile service acquisition, and wherein the TPC data includes FIC version information for indicating an update of the FIC data.

2. The method of claim 1, further comprising:

obtaining the signaling information table from the broadcast signal; and processing audio or video data of the mobile service data using the access information of the mobile service data included in the signaling information table.

3. The method of claim 1, wherein the broadcast signal further comprises known data sequences, and wherein at least two of the known data sequences are spaced 16 segments apart and have different lengths.

4. The method of claim 1, wherein the segment header comprises type information indicating a type of data carried in the FIC segment.

5. The method of claim 1, wherein the segment header comprises error indication information indicating whether the FIC segment contains an error.

6. A broadcast receiver comprising:
a tuner for receiving a broadcast signal, the broadcast signal comprising mobile service data, a signaling information table including access information of the mobile service data, a plurality of fast information channel (FIC) segments, and transmission parameter channel (TPC) data, wherein the plurality of FIC segments are comprised of FIC data, each FIC segment comprising a 2-byte segment header and a 35-byte segment payload including a portion of the FIC data,
wherein the signaling information table further includes number information specifying a number of mobile services signaled by the signaling information table, service identification information identifying a mobile service and a component descriptor for a component of the mobile service in the signaling information table, the component descriptor including sampling rate information identifying a sampling rate of an audio stream component,
wherein the signaling information table further includes component number information specifying a number of Internet Protocol (IP) stream components in the identified mobile service, component IP address flag information indicating whether component IP address information is present for an IP stream component, and the component IP address information specifying a source address of an IP datagram carrying the IP stream component;
a demodulator for demodulating the received broadcast signal; and
a first handler for collecting the FIC segments included in the demodulated broadcast signal and recovering the FIC data,
wherein the FIC data includes information for rapid mobile service acquisition, and wherein the TPC data includes FIC version information for indicating an update of the FIC data.

7. The broadcast receiver of claim 6, further comprising:
a second handler for obtaining the signaling information table from the broadcast signal; and
a processor for processing audio or video data of the mobile service data using the access information of the mobile service data included in the signaling information table.

8. The broadcast receiver of claim 6, wherein the broadcast signal further comprises known data sequences, and wherein at least two of the known data sequences are spaced 16 segments apart and have different lengths.

9. The broadcast receiver of claim 6, wherein the segment header comprises type information indicating a type of data carried in the FIC segment.

10. The broadcast receiver of claim 6, wherein the segment header comprises error indication information indicating whether the FIC segment contains an error.

11. A method of processing broadcast data in a broadcast transmitter, the method comprising:
performing, by a Reed Solomon (RS) encoder, RS encoding and Cyclic Redundancy Check (CRC) encoding on mobile service data and a signaling information table including access information of the mobile service data, thereby forming an RS frame,
wherein the signaling information table further includes number information specifying a number of mobile services signaled by the signaling information table, service identification information identifying a mobile service and a component descriptor for a component of the mobile service in the signaling information table, the component descriptor including sampling rate information identifying a sampling rate of an audio stream component,
wherein the signaling information table further includes component number information specifying a number of Internet Protocol (IP) stream components in the identified mobile service, component IP address flag information indicating whether component IP address information is present for an IP stream component, and the component IP address information specifying a source address of an IP datagram carrying the IP stream component;
dividing the RS frame into a plurality of groups, wherein each of the plurality of groups includes a portion of data included in the RS frame, known data sequences, a fast information channel (FIC) segment, and transmission parameter channel (TPC) data, wherein the FIC segment comprises a 2-byte segment header and a 35-byte segment payload including a portion of FIC data, the FIC data including information for rapid mobile service acquisition, and wherein the TPC data includes FIC version information for indicating an update of the FIC data; and
transmitting a broadcast signal including the plurality of groups,
wherein at least two of the known data sequences are spaced 16 segments apart and have different lengths.

12. The method of claim 11, wherein the RS frame comprises a plurality of packets, each packet having an M-byte header, k stuffing bytes, and an (N-M-k)-byte payload, the payload including an IP datagram of the mobile service data, the header including a type field indicating a type of all packets in the payload, wherein N and M are integers, and k is equal to or greater than 0.

13. The method of claim 11, wherein the FIC data is segmented into units of 35 bytes, and each 35-byte unit is carried through a corresponding segment payload.

14. The method of claim 11, wherein the segment header comprises type information indicating a type of data carried in the FIC segment.

15. The method of claim 11, wherein the segment header comprises error indication information indicating whether the FIC segment contains an error.

16. A broadcast transmitter comprising:
an RS encoder for performing Reed Solomon (RS) encoding and Cyclic Redundancy Check (CRC) encoding on mobile service data and a signaling information table including access information of the mobile service data, thereby forming an RS frame,
wherein the signaling information table further includes number information specifying a number of mobile services signaled by the signaling information table, service identification information identifying a mobile service and a component descriptor for a component of the mobile service in the signaling information table, the component descriptor including sampling rate information identifying a sampling rate of an audio stream component, wherein the signaling information table further includes component number information specifying a number of Internet Protocol (IP) stream components in the identified mobile service, component IP address flag information indicating whether component IP address information is present for an IP stream component, and the component IP address information specifying a source address of an IP datagram carrying the IP stream component, wherein the RS frame is divided into a plurality of groups, wherein each of the plurality of groups includes a portion of data included in the RS frame, known data sequences, a fast information channel (FIC) segment, and transmission parameter channel (TPC) data, wherein the FIC segment comprises a 2-byte segment header and a 35-byte segment payload including a portion of FIC data, the FIC data including information for rapid mobile service acquisition, and wherein the TPC data includes FIC version information for indicating an update of the FIC data; and a transmission unit for transmitting a broadcast signal including the plurality of groups, wherein at least two of the known data sequences are spaced 16 segments apart and have different lengths.

17. The broadcast transmitter of claim 16, wherein the RS frame comprises a plurality of packets, each packet having an M-byte header, k stuffing bytes, and an (N-M-k)-byte payload, the payload including an IP datagram of the mobile service data, the header including a type field indicating a type of all packets in the payload, wherein N and M are integers, and k is equal to or greater than 0.

18. The broadcast transmitter of claim 16, wherein the FIC data is segmented into units of 35 bytes, and each 35-byte unit is carried through a corresponding segment payload.

19. The broadcast transmitter of claim 16, wherein the segment header comprises type information indicating a type of data carried in the FIC segment.

20. The broadcast transmitter of claim 16, wherein the segment header comprises error indication information indicating whether the FIC segment contains an error.

* * * * *